(12) United States Patent
Lee

(10) Patent No.: US 9,502,475 B2
(45) Date of Patent: Nov. 22, 2016

(54) ORGANIC LIGHT EMITTING DEVICE

(71) Applicant: LG Display Co., Ltd., Seoul (KR)

(72) Inventor: Se Hee Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/552,795

(22) Filed: Nov. 25, 2014

(65) Prior Publication Data

US 2015/0155519 A1   Jun. 4, 2015

(30) Foreign Application Priority Data

Nov. 29, 2013   (KR) .................. 10-2013-0147742

(51) Int. Cl.
*H01L 33/00* (2010.01)
*H01L 27/32* (2006.01)
*H01L 51/52* (2006.01)

(52) U.S. Cl.
CPC ....... *H01L 27/3209* (2013.01); *H01L 51/5265* (2013.01); *H01L 51/5278* (2013.01)

(58) Field of Classification Search
CPC ........... H01L 51/5265; H01L 27/3211; H01L 51/5036; H01L 27/3209; H01L 51/5064
USPC ............... 257/40, 89; 313/504, 506
See application file for complete search history.

(56) References Cited

U.S. PATENT DOCUMENTS

| | | | |
|---|---|---|---|
| 6,924,025 B2 * | 8/2005 | Humbs | 428/167 |
| 7,273,663 B2 * | 9/2007 | Liao et al. | 428/690 |
| 7,812,529 B2 * | 10/2010 | Choi et al. | 313/506 |
| 8,227,981 B2 * | 7/2012 | Fukuda et al. | 313/506 |
| 8,338,222 B2 * | 12/2012 | Kim et al. | 438/99 |
| 8,466,455 B2 * | 6/2013 | Burrows | H01L 27/3211 257/103 |
| 8,569,744 B2 * | 10/2013 | Weaver | 257/40 |
| 2005/0225233 A1 * | 10/2005 | Boroson et al. | 313/504 |
| 2006/0006792 A1 * | 1/2006 | Strip | 313/500 |
| 2006/0220509 A1 * | 10/2006 | Ghosh et al. | 313/110 |

(Continued)

FOREIGN PATENT DOCUMENTS

| | | |
|---|---|---|
| CN | 101661951 A | 3/2010 |
| CN | 102610630 A | 7/2012 |
| JP | 2007059124 A | 3/2007 |

OTHER PUBLICATIONS

The First Office Action dated Jun. 20, 2016 from The State Intellectual Property Office of the People's Republic of China in counterpart Chinese application No. 201410709798.7.

*Primary Examiner* — Bradley K Smith
*Assistant Examiner* — David Goodwin
(74) *Attorney, Agent, or Firm* — Morgan, Lewis & Bockius LLP

(57) ABSTRACT

Disclosed is an organic light emitting device. The organic light emitting device includes a first emission unit configured to include a first red emission layer which emits red light, a first green emission layer which emits green light, and a first blue emission layer which emits blue light, a second emission unit configured to include a second red emission layer which emits red light, a second green emission layer which emits green light, and a second blue emission layer which emits blue light, a charge generation layer disposed between the first emission unit and the second emission unit, a first electrode formed as a reflective electrode, and configured to supply an electric charge having a first polarity to the first emission unit and the second emission unit, and a second electrode configured to supply an electric charge having a second polarity to the first and second emission units.

20 Claims, 9 Drawing Sheets

(56) References Cited

U.S. PATENT DOCUMENTS

| | | | |
|---|---|---|---|
| 2006/0244370 A1* | 11/2006 | Tyan et al. | 313/506 |
| 2007/0001588 A1* | 1/2007 | Boroson et al. | 313/504 |
| 2007/0075312 A1* | 4/2007 | Chin et al. | 257/40 |
| 2008/0111474 A1* | 5/2008 | Sung et al. | 313/504 |
| 2008/0268282 A1* | 10/2008 | Spindler et al. | 428/690 |
| 2009/0001885 A1* | 1/2009 | Spindler et al. | 313/506 |
| 2010/0090241 A1* | 4/2010 | D'Andrade et al. | 257/98 |
| 2011/0062475 A1* | 3/2011 | Cho | 257/98 |
| 2012/0012820 A1 | 1/2012 | Endo et al. | |
| 2012/0164772 A1* | 6/2012 | Lee | 438/34 |
| 2012/0299002 A1 | 11/2012 | Kinoshita | |
| 2012/0306359 A1* | 12/2012 | Okamoto et al. | 313/504 |
| 2013/0001526 A1* | 1/2013 | Kwak et al. | 257/40 |
| 2013/0147689 A1 | 6/2013 | Liu et al. | |
| 2013/0183482 A1* | 7/2013 | Hannen | 428/98 |
| 2014/0054556 A1* | 2/2014 | Park et al. | 257/40 |
| 2014/0117315 A1* | 5/2014 | Kim et al. | 257/40 |
| 2014/0151658 A1* | 6/2014 | Lee et al. | 257/40 |

* cited by examiner

FIG. 2

|  | blue (nm) | green (nm) | red (nm) |
|---|---|---|---|
| ETL | 35 | 35 | 35 |
| EML | 20 | 40 | 36 |
| red HTL | - | - | 90 |
| green HTL | - | 20 | - |
| HTL | 110 | 110 | 110 |
| HIL | 10 | 10 | 10 |

FIG. 4

|  | blue dopant PL<br>λ max intensity<br>(photo luminescence) | | green dopant PL<br>λ max intensity<br>(photo luminescence) | | green dopant PL<br>λ max intensity<br>(photo luminescence) | |
|---|---|---|---|---|---|---|
| comparative example | blue dopant | 456nm | green dopant | 518nm | red dopant | 620nm |
| first embodiment | blue EML 1<br><br>blue dopant 1<br>(Ba) | 456nm | green EML 1<br><br>green dopant 1<br>(Ga) | 518nm | red EML 1<br><br>red dopant 1<br>(Ra) | 620nm |
| | blue EML 2<br><br>blue dopant 1<br>(Ba) | 456nm | green EML 2<br><br>green dopant 1<br>(Ga) | 518nm | red EML 2<br><br>red dopant 1<br>(Ra) | 620nm |
| second embodiment | blue EML 1<br><br>blue dopant 1<br>(Ba) | 456nm | green EML 1<br><br>green dopant 1<br>(Ga) | 518nm | red EML 1<br><br>red dopant 1<br>(Ra) | 620nm |
| | blue EML 2<br><br>blue dopant 2<br>(Bb) | 466nm | green EML 2<br><br>green dopant 2<br>(Gb) | 538nm | red EML 2<br><br>red dopant 2<br>(Rb) | 624nm |

| | color | driving voltage V | current efficiency cd/A | power efficiency lm/W | color coordinates CIE_x | color coordinates CIE_y |
|---|---|---|---|---|---|---|
| comparative example | blue | 4.1 | 5.3 | 3.8 | 0.143 | 0.052 |
| | green | 3.9 | 114.2 | 91.8 | 0.215 | 0.732 |
| | red | 3.9 | 48.6 | 39 | 0.673 | 0.323 |
| first embodiment | blue | 7.2 | 7.8 | 3.3 | 0.143 | 0.050 |
| | green | 7.0 | 160.8 | 78 | 0.210 | 0.730 |
| | red | 7.2 | 70.2 | 27 | 0.675 | 0.324 |
| second embodiment | blue | 7.1 | 8.0 | 3.5 | 0.142 | 0.052 |
| | green | 6.4 | 177.6 | 87.3 | 0.247 | 0.712 |
| | red | 7.2 | 65.5 | 26 | 0.675 | 0.324 |

< First Embodiment >

< Second Embodiment >

ORGANIC LIGHT EMITTING DEVICE

CROSS-REFERENCE TO RELATED APPLICATIONS

This application claims the benefit of Korean Patent Application No. 10-2013-0147742 filed on Nov. 29, 2013, which is hereby incorporated by reference as if fully set forth herein.

BACKGROUND OF THE INVENTION

1. Field of the Invention

The present invention relates to an organic light emitting device, and more particularly, to an organic light emitting device, having a micro cavity emission structure, which satisfies a sense of color and in which emission efficiency and a service life are enhanced.

2. Discussion of the Related Art

To date, liquid crystal display (LCD) devices are being widely used as flat panel display devices. The LCD devices use a backlight as a separate light source, and have technical limitations in brightness and contrast. On the other hand, since organic light emitting devices self-emit light, the organic light emitting devices do not need a separate light source and have relatively better brightness, contrast, and viewing angle, and thus, interest in the organic light emitting devices is increasing. Also, since the organic light emitting devices do not use a backlight, the organic light emitting devices are manufactured to be light and thin, and have low power consumption and a fast response time.

The types of organic light emitting devices are categorized into a top emission type, a bottom emission type, and a dual emission type according to an emission direction of light. The organic light emitting devices are categorized into passive matrix organic light emitting devices and active matrix organic light emitting devices depending on a driving mode.

FIG. 1 is a diagram illustrating a red, green, and blue pixel structure of an organic light emitting device having a micro cavity structure of the related art. FIG. 1 illustrates a pixel structure of an active matrix organic light emitting device having a top emission type.

Referring to FIG. 1, the organic light emitting device includes an anode electrode 10, a cathode electrode 70, and an organic emission layer. The related art organic light emitting device has a structure in which the organic emission layer is formed between the cathode electrode 70 injecting an electron and the anode electrode 10 injecting a positive hole. A capping layer (CPL) 80 is formed on the cathode electrode 70.

In the micro cavity structure, the anode electrode 10 is formed as a reflective electrode, and the cathode electrode 70 is formed as a semi-transmissive electrode, thereby forming a micro cavity structure. An optical cavity is formed between the cathode electrode 70 and the anode electrode 10. The cathode electrode 70 transmits some (for example, 60% of all light) of light emitted from the organic emission layer, and the remaining light (for example, 40% of all light) which is not transmitted is reflected to cause constructive interference suitable for each wavelength, thereby enhancing emission efficiency.

The organic emission layer includes a hole injection layer (HIL) 20, a hole transport layer (HTL) 30, a plurality of emission layers (EMLs) 52, 54 and 56, an electron injection layer (EIL, not shown), and an electron transport layer (ETL) 60. In this case, the electron injection layer (EIL) may be omitted.

One unit pixel includes a red pixel Rp, a green pixel Gp, and a blue pixel Bp of three colors. The organic emission layer of the red pixel further includes a red HTL 42. The organic emission layer of the green pixel further includes a green HTL 44.

The red emission layer 52 of the red pixel Rp is formed between the ETL 60 and the red HTL 42. The green emission layer 54 of the green pixel Gp is formed between the ETL 60 and the green HTL 44. The blue emission layer 56 of the blue pixel Bp is formed between the ETL 60 and the HTL 30.

When an electron generated from the cathode electrode 70 and a positive hole generated from the anode electrode 10 are injected into the EMLs 52, 54 and 56, the injected electron and positive hole are combined to generate an exciton. The generated exciton is shifted from an excited state to a ground state to emit red light, green light, and blue light from the red EML 52, the green EML 54, and the blue EML 56.

Due to an emission structure and a material of the emission layer, the related art organic light emitting device has limitations in emission characteristic and a performance of a service life, and thus, a method has been proposed in which emission efficiency is enhanced by changing a fluorescent material, forming the emission layers 52, 54 and 56, to a phosphor material. However, the method has a problem in which consumption power is consumed in a case of increasing luminance. Also, the method has a problem in which emission efficiency is lowered when a light emitting material is changed for securing a long service life.

In addition, when a light emitting material is changed for increasing a light efficiency of each of a red pixel, a green pixel, and a blue pixel, a sense of color and a viewing angle are not satisfied in characteristic.

As a resolution of a display device advances to a high resolution, the number of pixels per unit area increases, and high luminance is needed. However, due to an emission structure of an organic light emitting device, a luminance Cd of a unit area A is limited. Also, since a current increases for enhancing luminance, a reliability of a device is degraded, and consumption power increases.

Moreover, among pixels of three colors of the organic light emitting device, a blue pixel has a shorter service life than those of a red pixel and a green pixel, and in manufacturing a display panel having the pixels of three colors, a service life of the display panel cannot be ensured.

Therefore, in order to solve main causes that hinder a quality of a productivity of an organic light emitting device, it is required to overcome technical limitations in enhancing a service life and emission efficiency of a device and decreasing consumption power. Also, it is required to develop an organic light emitting device for enhancing emission efficiency, a service life of an emission layer, and a viewing angle without any change in a sense of color.

SUMMARY OF THE INVENTION

Accordingly, the present invention is directed to provide an organic light emitting device that substantially obviates one or more problems due to limitations and disadvantages of the related art.

An object of the present invention is to provide an organic light emitting device in which emission efficiency is enhanced by using a micro cavity structure.

Another object of the present invention is to provide an organic light emitting device in which luminance is enhanced by using a micro cavity structure.

Another object of the present invention is to provide an organic light emitting device in which a service life is enhanced by using a micro cavity structure.

Another object of the present invention is to provide an organic light emitting device in which a viewing angle is improved by using a micro cavity structure.

Additional features and advantages of the invention will be set forth in part in the description which follows, and in part will be apparent from the description, or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an organic light emitting device, in which a micro cavity is disposed between a first electrode and a second electrode, includes a first emission unit configured to include a first red emission layer which emits red light, a first green emission layer which emits green light, and a first blue emission layer which emits blue light; a second emission unit configured to include a second red emission layer which emits red light, a second green emission layer which emits green light, and a second blue emission layer which emits blue light; a charge generation layer disposed between the first emission unit and the second emission unit; a first electrode formed as a reflective electrode, and configured to supply an electric charge having a first polarity to the first emission unit and the second emission unit; and a second electrode configured to supply an electric charge having a second polarity to the first emission unit and the second emission unit, wherein, a second electrode is a reflective electrode, and at least one selected from the first red emission layer, the first green emission layer, and the first blue emission layer has a wavelength range which differs from wavelength ranges of the second red emission layer, the second green emission layer, and the second blue emission layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 2 is a diagram illustrating a thickness of an organic emission layer (for example, ETL, EML, HTL, red HTL, green HTL, and HIL) formed on each of a red pixel, a green pixel, and a blue pixel of an organic light emitting device illustrated in FIG. 1;

FIG. 4 is a diagram showing main peaks of unique emission wavelengths of dopants applied to first and second emission layers according to embodiments of the present invention;

DETAILED DESCRIPTION OF THE ILLUSTRATED EMBODIMENTS

Figure 1:
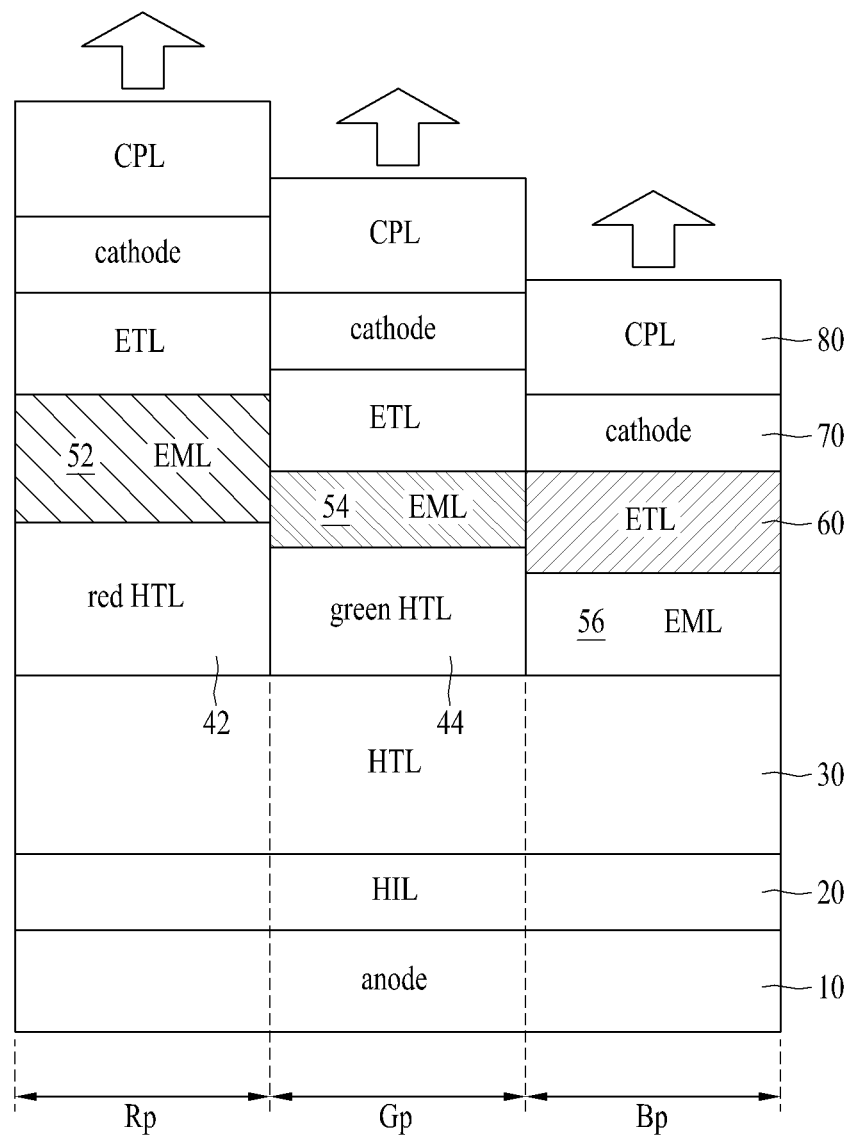
FIG. 1 is a diagram illustrating a red, green, and blue pixel structure of an organic light emitting device having a micro cavity structure of the related art.

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In description of embodiments of the present invention, when a structure is described as being formed at an upper portion/lower portion of another structure or on/under the other structure, this description should be construed as including a case where the structures contact each other and moreover a case where a third structure is disposed therebetween.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Before describing a pixel structure and a luminance characteristic of an organic light emitting device according to embodiments of the present invention, the related art organic light emitting device of FIG. 1 has been selected as a comparative example for analogizing an optical simulation result of the organic light emitting device according to embodiments of the present invention with actual luminance data.

Hereinafter color coordinates and an emission wavelength of the comparative example will be described with reference to the drawings. Next, embodiments of the present invention will be described in detail.

Comparative Example

An anode electrode 10 of the comparative example is a reflective electrode, and is formed in a structure where an indium tin oxide (ITO) layer (a thickness: 70 Å), a reflective layer (APC, a thickness: 100 Å), and an ITO layer (a thickness: 70 Å) are stacked. In this case, the reflective layer (APC) is formed of an alloy which contains silver (Ag) by 90% or more. The anode electrode 10 is formed in units of a unit pixel. One unit pixel is composed of a red pixel Rp, a green pixel Gp, and a blue pixel Bp of three colors, and the pixels of three colors are divided by a bank.

FIG. 2 is a diagram illustrating a thickness of an organic emission layer (for example, ETL, EML, HTL, red HTL, green HTL, and HIL) formed on each of a red pixel, a green pixel, and a blue pixel of an organic light emitting device illustrated in FIG. 1.

To provide a description with reference to FIG. 2, an organic emission layer is formed under the following conditions, for measuring color coordinates and an emission wavelength of the comparative example.

A hole injection layer (HIL) 20 is formed by depositing HAT-CN on an anode electrode 10 to a thickness of 10 nmnm. A hole transport layer (HTL) 30 is formed by depositing NPD on the HIL 20 to a thickness of 110 nmnm.

A green HIL 44 is formed in a green pixel area Gp by depositing TPD to a thickness of 20 nmnm. A red HTL 42 is formed in a red pixel area Rp by depositing NPD to a thickness of 90 nmnm. Also, a layer is formed of TPD to have a thickness of 10 nmnm in a whole area.

A red EML 52 is formed in a red pixel area Rp. The red EML 52 is formed to a thickness of 36 nmnm by doping btp2Ir(acac) (which is a red dopant (RD)) on Be complex derivatives (which are a red host (RH)) by 5%.

A green EML 54 is formed in a green pixel area Gp. The green EML 54 is formed to a thickness of 40 nm by doping ppy2Ir(acac) (which is a green dopant (GD)) on CBP (which is a green host (GH)) by 5%.

A blue EML 56 is formed in a blue pixel area Bp. The blue EML 56 is formed to a thickness of 20 nm by doping Pyren derivatives (which are a blue dopant (BD)) on Anthracene derivatives (which are a blue host (BH)) by 5%.

An ETL 60 is formed by doping $Alq_3$ on the EMLs 52, 54 and 56 to a thickness of 35 nm. A second electrode (a cathode electrode) 70 which is a transmissive electrode or a semi-transmissive electrode is formed by forming a LiF layer on the ETL 60 to a thickness of 15 Å and forming a Ag:Mg layer at a ratio of 1:1 to a thickness of 160 Å. A capping layer 80 is formed by depositing NPD to a thickness of 65 nm to cover a pixel.

An organic emission layer is formed under the conditions, and then, a result of measurement of color coordinates of a red pixel, a green pixel, and a blue pixel is listed in the following Table 1.

TABLE 1

| color | | blue | green | red |
|---|---|---|---|---|
| color | CIE_x | 0.145 | 0.210 | 0.675 |
| | CIE_y | 0.055 | 0.730 | 0.323 |

Referring to Table 1, in color coordinates of blue light in a blue pixel Bp, it has been measured that CIE_x is 0.145, and CIE_y is 0.055. In color coordinates of green light in a green pixel Gp, it has been measured that CIE_x is 0.210, and CIE_y is 0.730. In color coordinates of blue light in a blue pixel Bp, it has been measured that CIE_x is 0.675, and CIE_y is 0.323.

In an organic light emitting device using a cavity structure, a dopant having an emission wavelength of a maximum peak is needed in desired color coordinates where an emission peak of light emitted through a cavity becomes the maximum and desired color light is obtained.

When desired color coordinates do not match an optical overlap of an emission wavelength, light efficiency is reduced, and a viewing angle is also narrowed.

In the color coordinates listed in Table 1, color coordinates CIE_y of blue, color coordinates CIE_x of green, and color coordinates CIE_x of red is closely relevant to a main peak of an emission wavelength, and thus are very important.

For reference, when an image is displayed by the organic light emitting device, a color coordinate margin of CIE_y of blue, a color coordinate margin of CIE_x of green, and a color coordinate margin of CIE_x of red are listed in the following Table 2.

TABLE 2

| red CIE_x | 0.670~0.678 |
|---|---|
| green CIE_x | 0.210~0.260 |
| blue CIE_y | 0.045~0.060 |

In the comparative example described above with reference to FIGS. 1 and 2, in order to satisfy desired color coordinates, blue PL λ max Intensity may be obtained by selecting a wavelength of 450 nm to 458 nm. Green PL λ max Intensity may be obtained by selecting a wavelength of 510 nm to 520 nm. Red PL λ max Intensity may be obtained by selecting a wavelength of 610 nm to 620 nm.

Embodiment of the Present Invention

Figure 3:
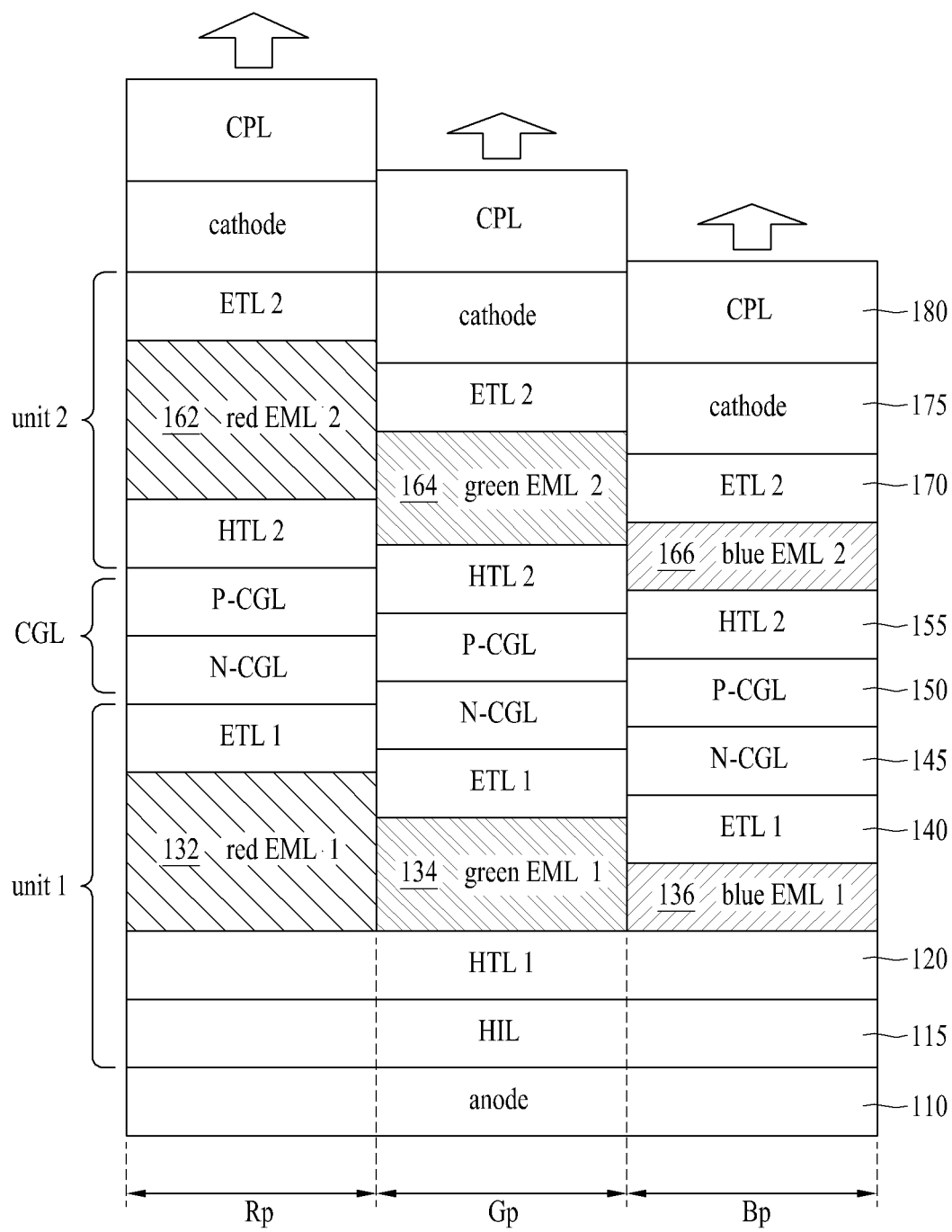
FIG. 3 is a diagram illustrating a red, green, and blue pixel structure of an organic light emitting device according to embodiments of the present invention.

FIG. 3 is a diagram illustrating a red, green, and blue pixel structure of an organic light emitting device according to embodiments of the present invention. FIG. 3 illustrates a pixel structure having a top emission type to which a micro cavity structure is applied.

Referring to FIG. 3, an organic light emitting device according to an embodiment of the present invention includes a first electrode (an anode electrode) 110, a second electrode (a cathode electrode) 175, and an organic emission layer. The organic light emitting device has a structure in which the organic emission layer is formed between the first electrode (the anode electrode) 110 injecting a positive hole and the second electrode (the cathode electrode) 175 injecting an electron. A capping layer (CPL) 180 is formed on the second electrode (the cathode electrode) 175.

The organic light emitting device according to an embodiment of the present invention has a micro cavity structure, and one unit pixel includes a red pixel Rp, a green pixel Gp, and a blue pixel Bp of three colors.

The organic emission layer of the organic light emitting device according to an embodiment of the present invention is formed in a structure of two emission units (2unit). A first emission unit (unit1) and a second emission unit (unit2) of the organic emission layer have a structure that emits light of the same color.

The first emission unit (unit1) of the red pixel Rp includes a first red emission layer (red EML1) 132 that emits red light, and the second emission unit (unit2) of the red pixel Rp includes a second red emission layer (red EML2) 162 that emits red light.

The first emission unit (unit1) of the green pixel Gp includes a first green emission layer (green EML1) 134 that emits green light, and the second emission unit (unit2) includes a second green emission layer (green EML2) 164 that emits green light.

The first emission unit (unit1) of the blue pixel Bp includes a first blue emission layer (blue EML1) 136 that emits blue light, and the second emission unit (unit2) includes a second blue emission layer (blue EML2) 166 that emits blue light.

The first electrode (the anode electrode) 110 is formed as a reflective electrode, and the second electrode (the cathode electrode) 175 is formed as a semi-transmissive electrode, thereby forming a micro cavity.

Here, the first electrode (the anode electrode) 110 is the reflective electrode, and is formed in a structure where an ITO layer (a thickness: 70 Å), a reflective layer (APC, a thickness: 100 Å), and an ITO layer (a thickness: 70 Å) are stacked. In this case, the reflective layer (APC) is formed of an alloy which contains silver (Ag) by 90% or more.

A material of the reflective layer (APC) may use palladium (Pd), copper (Cu), indium (In), or neodymium (Nd), in addition to Ag. Also, the material of the APC may use an alloy in which at least one selected from Pd, Cu, In, and Nd is added into Ag.

The first electrode (the anode electrode) 110 is formed in units of one unit pixel. One unit pixel is composed of a red pixel, a green pixel, and a blue pixel of three colors, and the pixels of three colors are divided by a bank (not shown).

The second electrode (the cathode electrode) 175 which is the semi-transmissive electrode is formed to the same thickness in the red pixel Rp, the green pixel Gp, and the blue pixel Bp. For example, the second electrode (the cathode electrode) 175 is formed as the semi-transmissive electrode by forming a LiF layer on a second ETL (ETL2) 170 to a thickness of 15 Å and forming a Ag:Mg layer at a ratio of 1:1 to a thickness of 160 Å.

An optical cavity is formed between the first electrode (the anode electrode) 110 and the second electrode (the cathode electrode) 175. The second electrode (the cathode electrode) 175 transmits some (for example, 60%) of light emitted from the organic emission layer, and light (for example, 40%) which is not transmitted is reflected to cause constructive interference suitable for each wavelength, thereby enhancing emission efficiency.

The organic emission layer include an HIL 115, a first HTL (HTL1) 120, a first red EML (red EML1) 132, a first green EML (green EML1) 134, a first blue EML (blue EML1) 136, a first ETL (ETL1) 140, a first charge generation layer (N-CGL) 145, a second charge generation layer (P-CGL) 150, a second HTL (HTL2) 155, a second red EML (red EML2) 162, a second green EML (green EML2) 164, a second blue EML (blue EML2) 166, and a second ETL (ETL2) 170.

The HIL 115 is formed on the first electrode (the anode electrode) 110, and the first HTL (HTL1) 120 is formed on the HIL 115. The first red EML (red EML1) 132 is formed in a red pixel area Rp. The first green EML (green EML1) 134 is formed in a green pixel area Gp. The first blue EML (blue EML1) 136 is formed in a blue pixel area Bp, on the first HTL (HTL1) 120.

The first ETL (ETL1) 140 is formed on the first red EML (red EML1), the first green EML (green EML1) 134, and the first blue EML (blue EML1) 136. A charge generation layer (CGL) is formed as an optical compensation layer on the first ETL (ETL1) 140.

The charge generation layer (CGL) includes the first charge generation layer (N-CGL) 145 and the second charge generation layer (P-CGL) 150. The first charge generation layer (N-CGL) 145 is formed on the first ETL (ETL1) 140. The second charge generation layer (P-CGL) 150 is formed on the first charge generation layer (N-CGL) 145.

The second red EML (red EML2) 162 is formed in the red pixel area Rp on the second charge generation layer (P-CGL) 150. The second green EML (green EML2) 164 is formed in the green pixel area Gp. The second blue EML (blue EML2) 166 is formed in the blue pixel area Bp.

The second ETL (ETL2) 170 is formed on the second red EML (red EML2) 162, the second green EML (green EML2) 164, and the second blue EML (blue EML2) 166. The cathode 175 is formed on the second ETL 170, and the capping layer 180 is formed on the cathode 175.

The first emission unit (unit1) of the organic emission layer includes the HIL 115, the first HTL (HTL1) 120, the first red EML (red EML1) 132, the first green EML (green EML1) 134, the first blue EML (blue EML1) 136, and the first ETL (ETL1) 140.

The second emission unit (unit2) of the organic emission layer includes the second HTL (HTL2) 155, the second red EML (red EML2) 162, the second green EML (green EML2) 164, the second blue EML (blue EML2) 166, and the second ETL (ETL2) 170.

The first charge generation layer (N-CGL) 145 and the second charge generation layer (P-CGL) 150 are formed between the first emission unit (unit1) and the second emission unit (unit2).

The organic emission layer of the red pixel Rp is formed to a thickness of 250 nm to 300 nm. A thickness of the organic emission layer of the red pixel Rp denotes a thickness of a gap between the first electrode (the anode electrode) 110 and the second electrode (the cathode electrode) 175.

The organic emission layer of the green pixel Gp is formed to a thickness of 200 nm to 270 nm. A thickness of the organic emission layer of the green pixel Gp denotes the thickness of the gap between the first electrode (the anode electrode) 110 and the second electrode (the cathode electrode) 175.

The organic emission layer of the blue pixel Bp is formed to a thickness of 150 nm to 230 nm. A thickness of the organic emission layer of the blue pixel Bp denotes the thickness of the gap between the first electrode (the anode electrode) 110 and the second electrode (the cathode electrode) 175.

The first red EML (red EML1) 132 and the second red EML (red EML2) 162 are formed to a thickness of 65 nm to 85 nm.

The first green EML (green EML1) 134 and the second green EML (green EML2) 164 are formed to a thickness of 35 nm to 50 nm.

The first blue EML (blue EML1) 136 and the second blue EML (blue EML2) 166 are formed to a thickness of 15 nm to 30 nm.

Here, the first red EML (red EML1) 132 in the red pixel Rp of the first emission unit and the second red EML (red EML2) 162 formed in the red pixel Rp of the second emission unit may be formed to different thicknesses.

However, the present invention is not limited thereto. For example, the first red EML (red EML1) 132 in the red pixel Rp of the first emission unit and the second red EML (red EML2) 162 formed in the red pixel Rp of the second emission unit may be formed to the same thickness.

The first green EML (green EML1) 134 in the green pixel Gp of the first emission unit and the second green EML (green EML2) 164 formed in the green pixel Gp of the second emission unit may be formed to different thicknesses.

However, the present invention is not limited thereto. For example, the first green EML (green EML1) 134 in the green pixel Gp of the first emission unit and the second green EML (green EML2) 164 formed in the green pixel Gp of the second emission unit may be formed to the same thickness.

The first blue EML (blue EML1) 136 in the blue pixel Bp of the first emission unit and the second blue EML (blue EML2) 166 formed in the blue pixel Bp of the second emission unit may be formed to different thicknesses.

However, the present invention is not limited thereto. For example, the first blue EML (blue EML1) 136 in the blue pixel Bp of the first emission unit and the second blue EML (blue EML2) 166 formed in the blue pixel Bp of the second emission unit may be formed to the same thickness.

The HIL 115, the first HTL (HTL1) 120, the first ETL (ETL1) 140, the first charge generation layer (N-CGL) 145, the second charge generation layer (P-CGL) 150, the second HTL (HTL2) 155, the second ETL (ETL2) 170, the cathode 175, and the capping layer 180 are formed in common in correspondence with the red pixel Rp, the green pixel Gp, and the blue pixel Bp.

The HIL 115, the first HTL (HTL1) 120, the first ETL (ETL1) 140, the first charge generation layer (N-CGL) 145, the second charge generation layer (P-CGL) 150, the second HTL (HTL2) 155, the second ETL (ETL2) 170, the cathode 175, and the capping layer 180 are formed to the same thickness in the red pixel Rp, the green pixel Gp, and the blue pixel Bp.

Red light, green light, and blue light are emitted by adjusting a charge balance of a positive hole and an electron and an exciton generation area in which light is emitted in the EML.

Each of the red pixel Rp, the green pixel Gp, and the blue pixel Bp has a micro cavity structure, and control of a color cavity may be applied for adjusting a sense of color.

Here, the blue pixel Bp may adjust a sense of color of blue light by controlling a thickness of the first HTL (HTL1) 120 of the first emission unit.

The red pixel Rp and the green pixel Gp may adjust a sense of color of red light and green light by controlling a thickness of the EML. A sense of color of red light may be adjusted by controlling a thickness of at least one selected from the first red EML (red EML1) 132 and the second red EML (red EML2) 162. A sense of color of green light may be adjusted by controlling a thickness of at least one selected from the first green EML (green EML1) 134 and the second green EML (green EML2) 164.

That is, in the red pixel Rp, a sense of color of red light is satisfied by controlling an optical distance of a color cavity by using a thickness of at least one selected from the first red EML (red EML1) 132 and the second red EML (red EML2) 162.

In the green pixel Gp, a sense of color of green light is satisfied by controlling an optical distance of a color cavity by using a thickness of at least one selected from the first green EML (green EML1) 134 and the second green EML (green EML2) 164.

The first red EML (red EML1) 132 and the second red EML (red EML2) 162 which are formed in the red pixel Rp respectively emit red lights having different wavelength ranges of 30 nm or less. The first red EML (red EML1) 132 and the second red EML (red EML2) 162 may respectively emit red lights having different wavelength ranges of 30 nm or less by applying emission dopants which emit lights having different emission wavelengths.

The first red EML (red EML1) 132 and the second red EML (red EML2) 162 which are formed in the red pixel Rp respectively emit red lights having different wavelengths, and the red lights having the different wavelengths are emitted as red light having one emission wavelength due to an effect of a micro cavity.

The first green EML (green EML1) 134 and the second green EML (green EML2) 164 which are formed in the green pixel Gp respectively emit green lights having different wavelength ranges of 30 nm or less. The first green EML (green EML1) 134 and the second green EML (green EML2) 164 may respectively emit green lights having different wavelength ranges of 30 nm or less by applying emission dopants which emit lights having different emission wavelengths.

The first green EML (green EML1) 134 and the second green EML (green EML2) 164 respectively emit green lights having different wavelengths, and the green lights having the different wavelengths are emitted as green light having one emission wavelength due to an effect of a micro cavity.

The first blue EML (blue EML1) 136 and the second blue EML (blue EML2) 166 which are formed in the blue pixel Bp respectively emit blue lights having different wavelength ranges of 30 nm or less. The first blue EML (blue EML1) 136 and the second blue EML (blue EML2) 166 may respectively emit blue lights having different wavelength ranges of 30 nm or less by applying emission dopants which emit lights having different emission wavelengths.

The first blue EML (blue EML1) 136 and the second blue EML (blue EML2) 166 respectively emit blue lights having different wavelengths, and the blue lights having the different wavelengths are emitted as blue light having one emission wavelength due to an effect of a micro cavity.

A phosphor material forming the red EML, the green EML, and the blue EML has a long service life, but is low in light efficiency. On the other hand, the phosphor is high in light efficiency, but has a short service life.

In the organic light emitting device according to an embodiment of the present invention, the first EML (EML1) and second EML (EML2) of each of the red pixel Rp, the green pixel Gp, and the blue pixel Bp may be formed of different materials, for enhancing a light efficiency and a service life of the red pixel Rp, the green pixel Gp, and the blue pixel Bp.

Material of Organic Emission Layer

The HIL 115 may be formed of HAT-CN, TBAHA, $F_4$-TCNQ, or CuPc described in the following Formula 1.

[Formula 1]
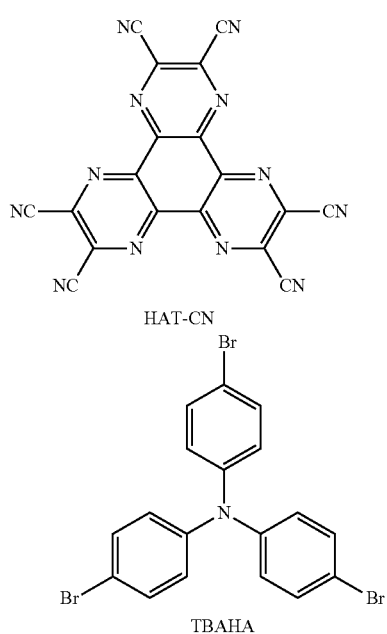
HAT-CN
TBAHA
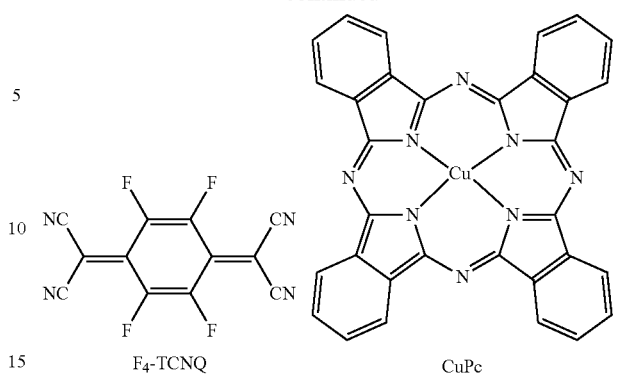
F4-TCNQ          CuPc
-continued
The first ETL (ETL1) 140 and the second ETL (ETL2) 170 may be formed of spiro-PBD, BMB-3T, PF-6P, PyPySPyPy, COT, TPBI, oxadiazole derivatives, or Anthracene derivatives described in the following Formulas 2 to 9.
[Formula 2]
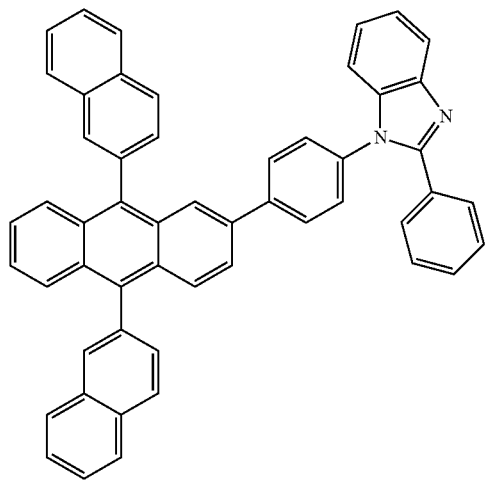
[Formula 3]
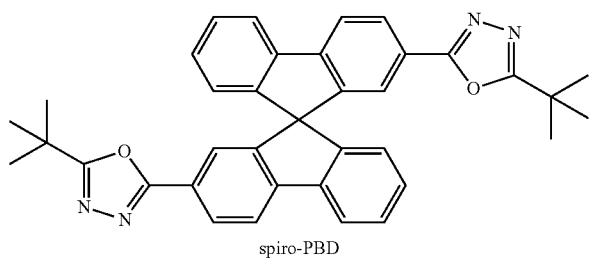
spiro-PBD -continued
[Formula 4]
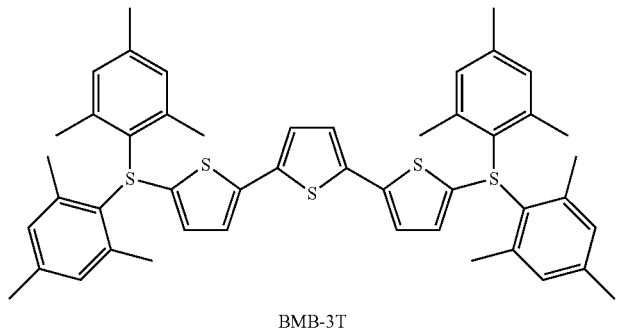
BMB-3T
[Formula 5]
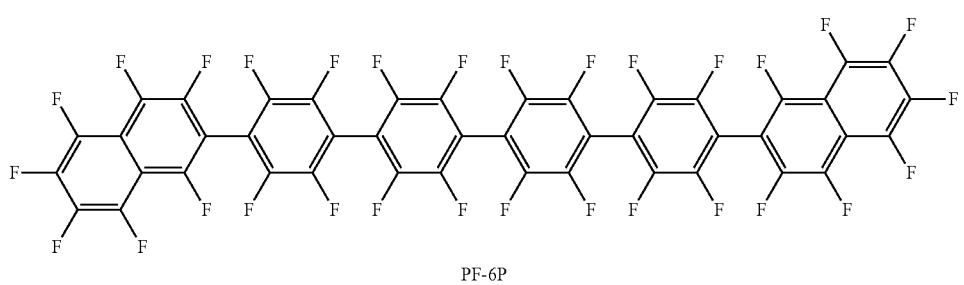
PF-6P
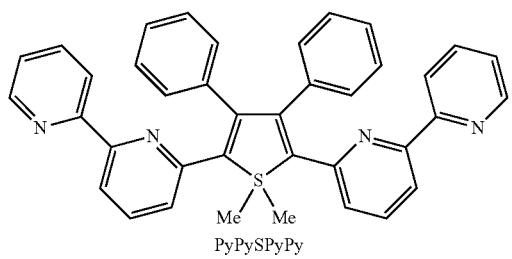
PyPySPyPy
[Formula 7]
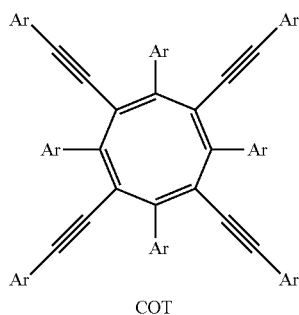
COT
[Formula 8]
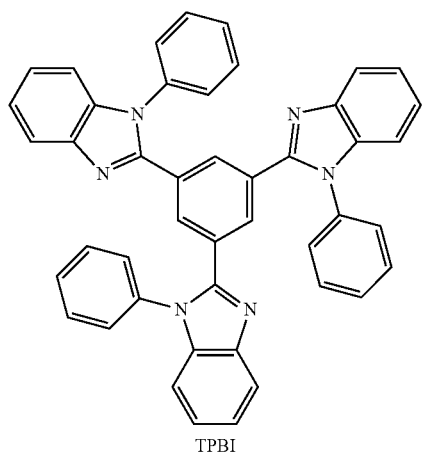
TPBI

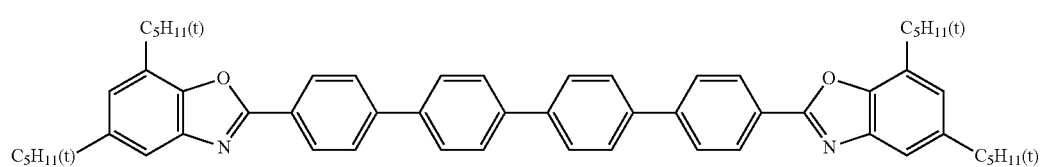
[Formula 9]
A phosphor material of the blue EML may use materials of the following Formulas 10 to 17.
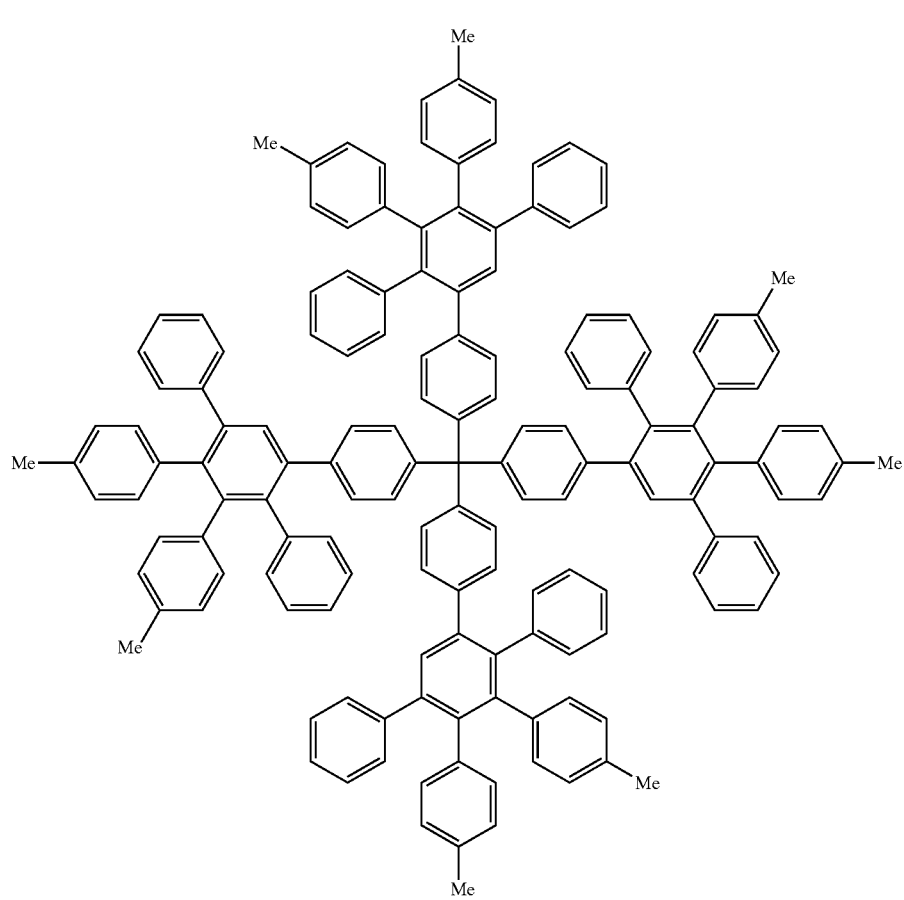
[Formula 10]
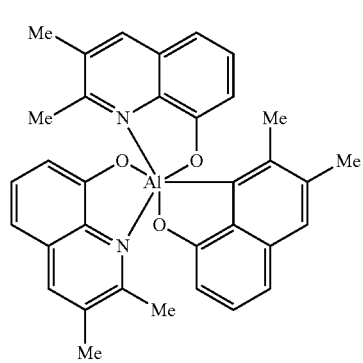
Aldmq₃
[Formula 11]
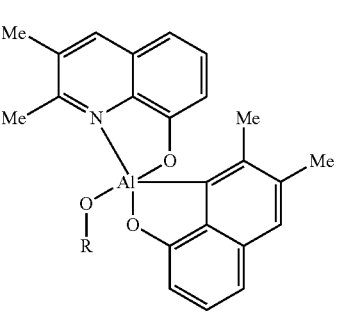
SAlq/AlMq₂OH
[Formula 12]

[Formula 13]
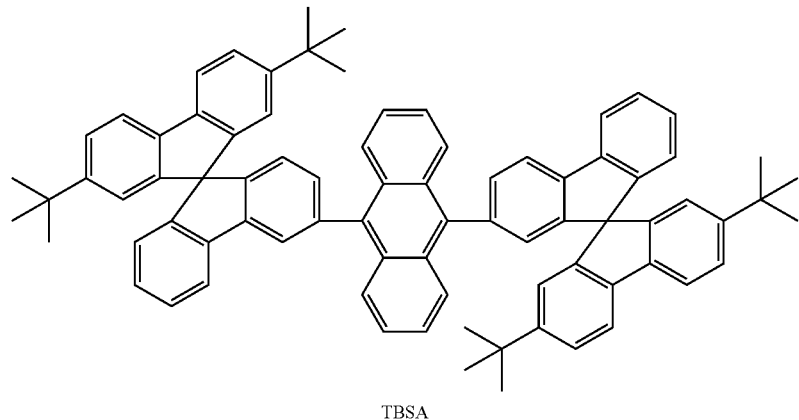
TBSA
[Formula 14]
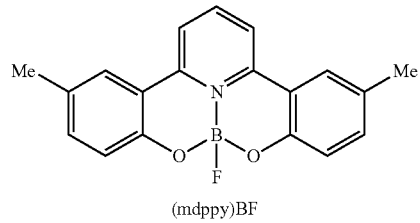
(mdppy)BF
[Formula 15]
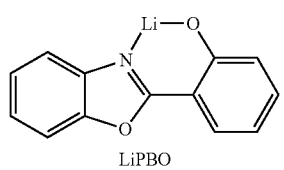
LiPBO
[Formula 16]
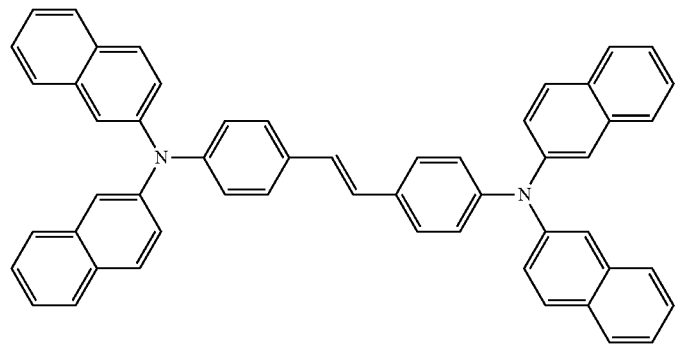
[Formula 17]
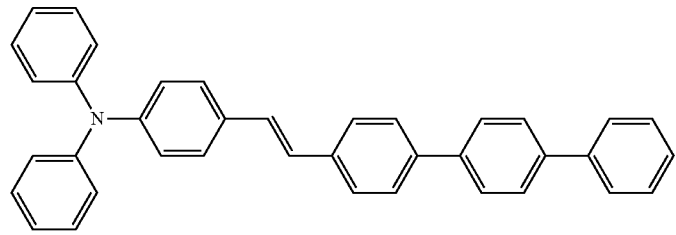

A host (BH) of a blue fluorescent material may use a material of the following Formula 18.

[Formula 18]

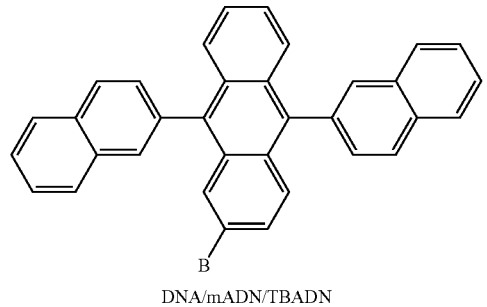

DNA/mADN/TBADN

A dopant (BD) of the blue fluorescent material may use a material of the following Formula 19.

[Formula 19]

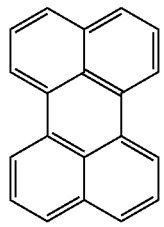

Perylene

However, the present embodiment is not limited thereto. A material of the blue EML may use DAS, DSA-amin, 1-DNA, DNA/mADN/TBADN, or spiro-oligo(phenylene), and a light emitting material having various structures and various derivatives may be applied.

A green fluorescent material may use materials of the following Formulas 20 to 25.

[Formula 20]

C545T

[Formula 21]

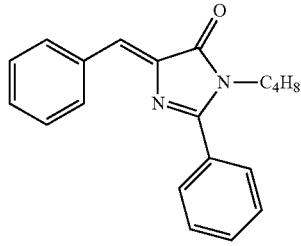

[Formula 22]

[Formula 23]

[Formula 24]

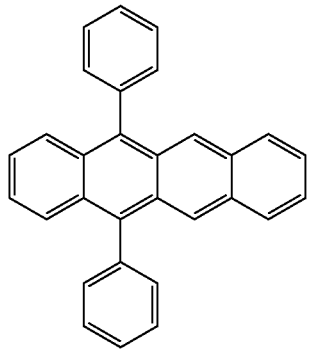

[Formula 25]

Quinacridone

A red fluorescent material may use materials of the following Formulas 26 to 30.

[Formula 26]
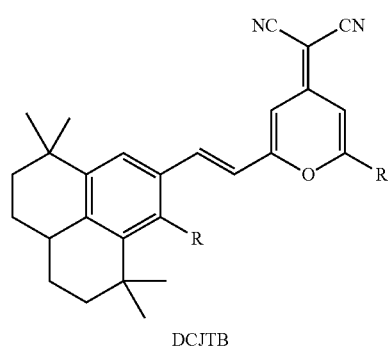
DCJTB
[Formula 27]
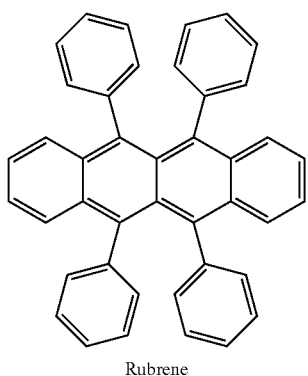
Rubrene
[Formula 28]
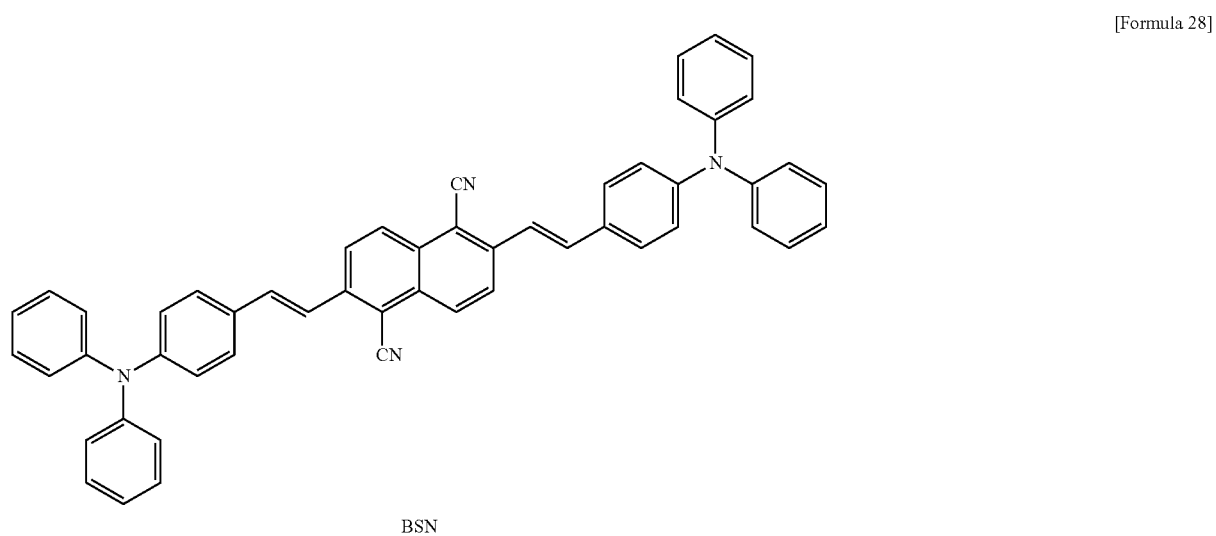
BSN
[Formula 29]
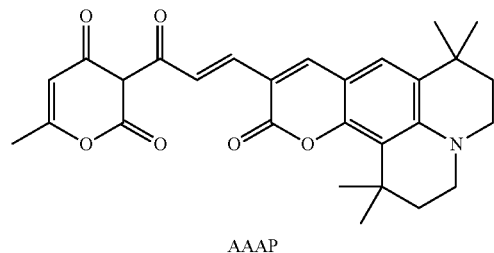
AAAP
[Formula 30]
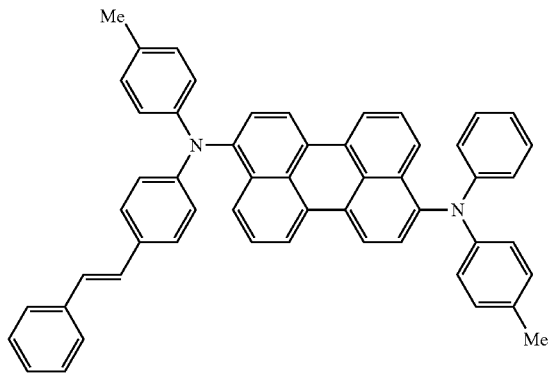
(PPA)(PSA)Pe-1

A host of a phosphor material of the blue EML may use materials of the following Formulas 31 to 37.
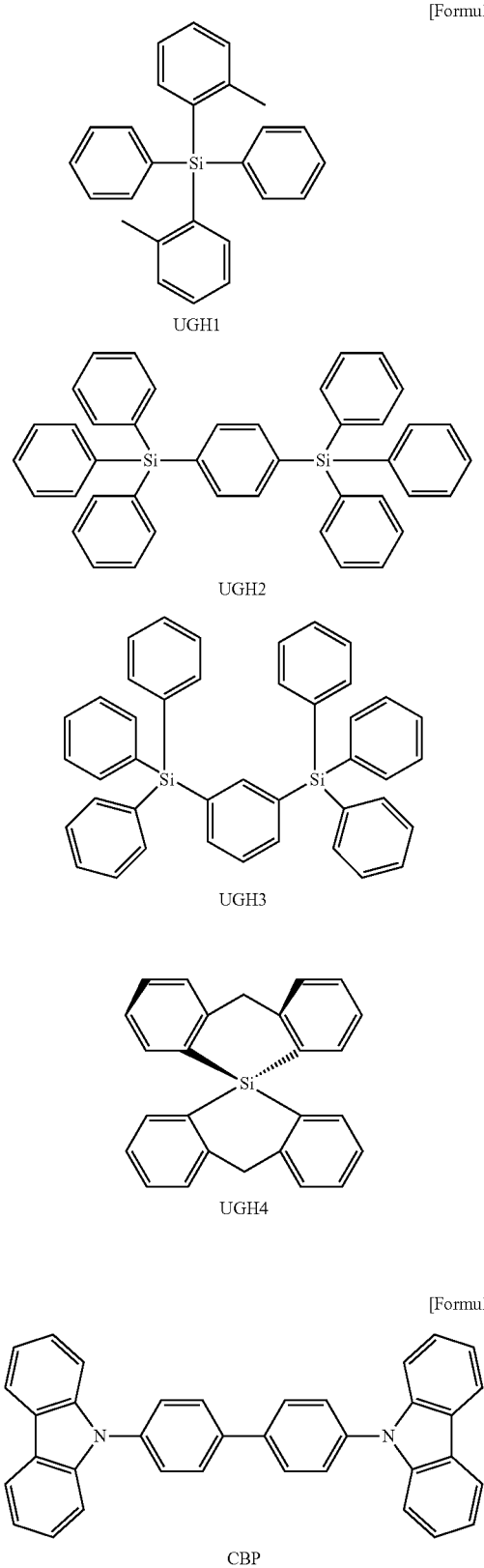
[Formula 31]
UGH1
UGH2
UGH3
UGH4
[Formula 32]
CBP
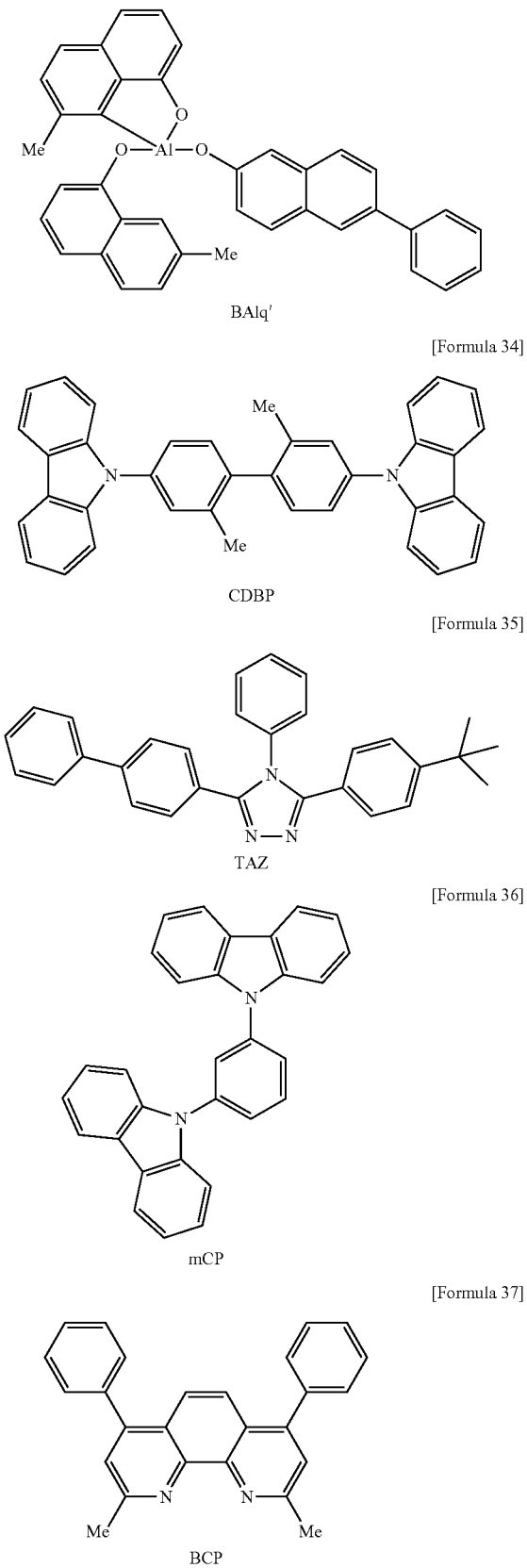
[Formula 33]
BAlq′
[Formula 34]
CDBP
[Formula 35]
TAZ
[Formula 36]
mCP
[Formula 37]
BCP A host of a phosphor material of each of the red EML and the green EML may use materials of the following Formulas 38 to 44.
[Formula 38]
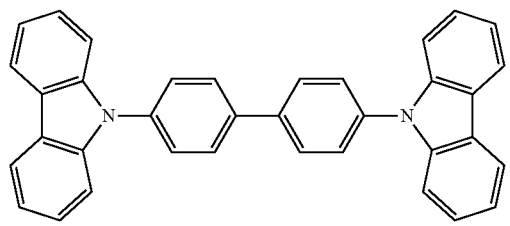
CBP
[Formula 39]
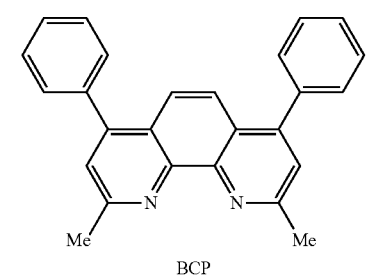
BCP
[Formula 40]
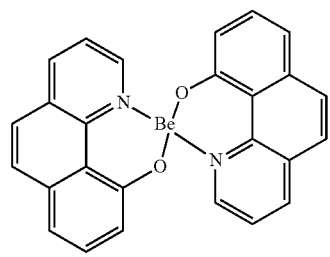
BeBq$_2$
[Formula 41]
CDBP
[Formula 42]
TAZ
[Formula 43]
mCP
[Formula 44]
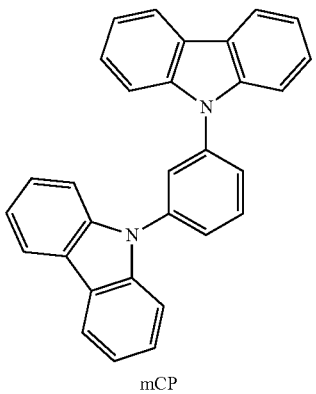
BAlq'
A dopant of a phosphor material of the red EML may use a material of the following Formula 45.
[Formula 45]
PtOEP
(650 nm)

-continued

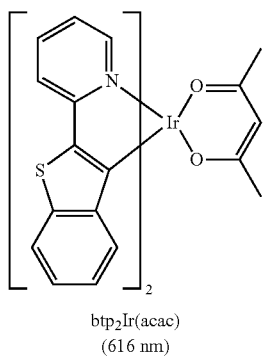

btp₂Ir(acac)
(616 nm)

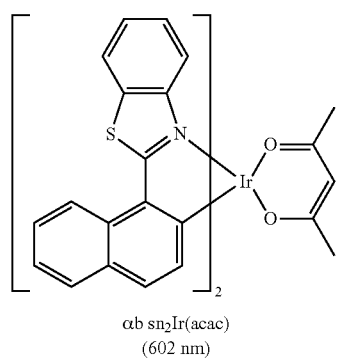

αb sn₂Ir(acac)
(602 nm)

A dopant of a phosphor material of the green EML may use a material of the following Formula 46.

[Formula 46]

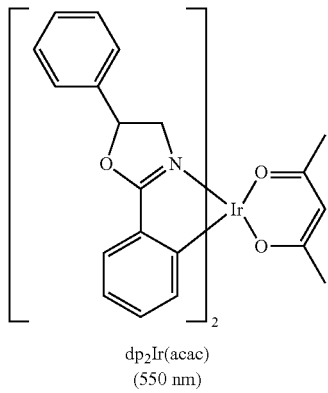

dp₂Ir(acac)
(550 nm)

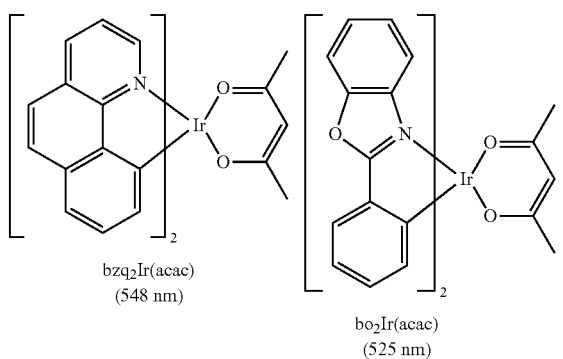

bzq₂Ir(acac)
(548 nm)

bo₂Ir(acac)
(525 nm)

-continued

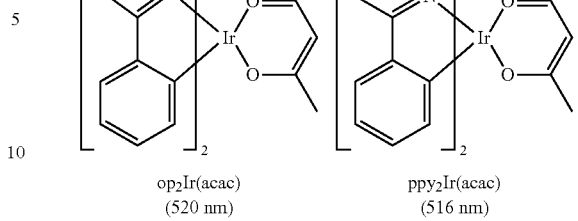

op₂Ir(acac)          ppy₂Ir(acac)
(520 nm)             (516 nm)

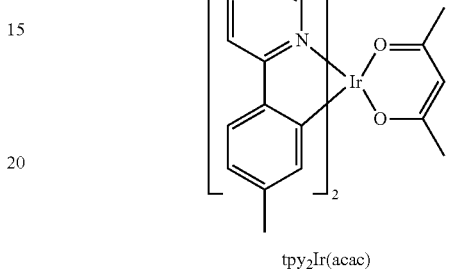

tpy₂Ir(acac)
(512 nm)

A dopant of a phosphor material of the blue EML may use a material of the following Formula 47.

[Formula 47]

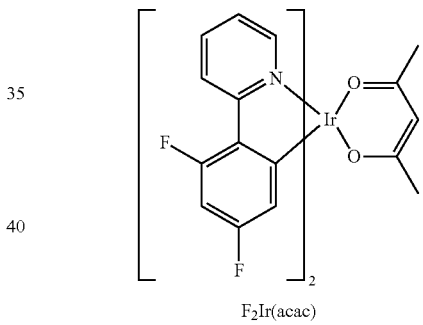

F₂Ir(acac)
(490 nm)

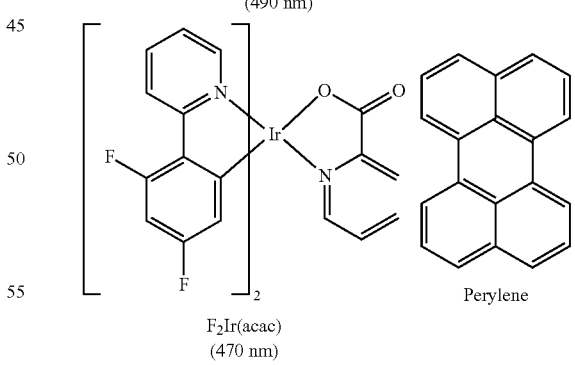

F₂Ir(acac)                    Perylene
(470 nm)

However, the present embodiment is not limited thereto. For example, a host of a phosphor material may be changed to various derivatives, and a dopant of a phosphor material may contain Ir complex.

At least one selected from the EML (ELM1) of the first emission unit (unit1) and the EML (ELM2) of the second emission unit (unit2) may be formed by mixing two or more kinds of hosts. Also, at least one selected from the EML (ELM1) of the first emission unit (unit1) and the EML (ELM2) of the second emission unit (unit2) may be formed by mixing two or more kinds of dopants.

Experiment Conditions of First Embodiment of the Present Invention

A first electrode (an anode electrode) 110 is a reflective electrode, and is formed in a structure where an ITO layer (a thickness: 70 Å), a reflective layer (APC, a thickness: 100 Å), and an ITO layer (a thickness: 70 Å) are stacked. In this case, the reflective layer (APC) is formed of an alloy which contains silver (Ag) by 90% or more.

The first electrode (the anode electrode) 110 is formed in units of one unit pixel. One unit pixel is composed of a red pixel, a green pixel, and a blue pixel of three colors, and the pixels of three colors are divided by a bank (not shown).

A hole injection layer (HIL) 115 is formed by depositing an HAT-CN material on the first electrode (the anode electrode) 110 to a thickness of 10 nm. A hole transport layer (HTL) 120 is formed by depositing NPD on the HIL 115 to a thickness of 37.5 nm.

A first red EML (red EML1) 132 is formed in a red pixel area Rp on a first HTL (HTL1) 120. The first red EML (red EML1) 132 is formed to a thickness of 70 nm by doping Ir derivatives (Ra, a first red dopant) on Be complex derivatives (a red host (RH)) by 5%.

A first green EML (green EML1) 134 is formed in a green pixel area Gp on the first HTL (HTL1) 120. The first green EML (green EML1) 134 is formed to a thickness of 40 nm by doping Ir derivatives (Ga, a green dopant (GD), namely, a first green dopant) on Anthracene derivatives (a green host (GH)) by 5%.

A first blue EML (blue EML1) 136 is formed in a blue pixel area Bp on the first HTL (HTL1) 120. The first blue EML (blue EML1) 136 is formed to a thickness of 20 nm by doping Pyren derivatives (Ba, a blue dopant (BD), namely, a first blue dopant) on Anthracene derivatives (a green host (GH)) by 5%.

A first ETL (ETL1) is formed by doping $Alq_3$ on the first red EML (red EML1) 132, the first green EML (green EML1) 134, and the first blue EML (blue EML1) 136 to a thickness of 25 nm.

A first charge generation layer (N-CGL) 145 is formed on a first ETL 140. The first generation layer (N-CGL) 145 is formed to a thickness of 10 nm by doping Li on Anthracene derivatives by 2%.

A second charge generation layer (P-CGL) 150 is formed by depositing HAT-CN on the first charge generation layer (N-CGL) 145 to a thickness of 10 nm.

A second HTL (HTL2) 155 is formed by depositing NPD on the second charge generation layer (P-CGL) 150 to a thickness of 37.5 nm.

A second red EML (red EML2) 162 is formed in a red pixel area Rp on the second HTL (HTL2) 155. The second red EML (red EML2) 162 is formed to a thickness of 70 nm by doping Ir derivatives (Rb, a red dopant (RD), namely, a second red dopant) on Be complex derivatives (a red host (RH)) by 5%.

A second green EML (green EML2) 164 is formed in a green pixel area Gp on the second HTL (HTL2) 155. The second green EML (green EML2) 164 is formed to a thickness of 40 nm by doping Ir derivatives (Gb, a green dopant (GD), namely, a second green dopant) on Anthracene derivatives (a green host (GH)) by 5%.

A second blue EML (blue EML2) 166 is formed in a blue pixel area Bp on the second HTL (HTL2) 155. The second blue EML (blue EML2) 166 is formed to a thickness of 20 nm by doping Pyren derivatives (Bb, a blue dopant (BD), namely, a second blue dopant) on Anthracene derivatives (a blue host (BH)) by 5%.

A second ETL (ETL2) 170 is formed by depositing, to a thickness of 35 nm, $Alq_3$ and LiQ on the second red EML (red EML2) 162, the second green EML (green EML2) 164, and the second blue EML (blue EML2) 166 at a ratio of 1:1.

A second electrode (a cathode electrode) 175 which is a semi-transmissive electrode is formed by forming a Mg:LiF layer on the second ETL (ETL2) 170 to a thickness of 15 Å and forming a Ag:Mg layer at a ratio of 1:1 to a thickness of 160 Å.

A capping layer 180 is formed by depositing NPD on the second electrode (the cathode electrode) 175 to a thickness of 65 nm to cover a pixel.

When a dopant is the same irrespective of a case where a host of each of a red EML, a green EML, and a blue EML is a fluorescent material or a phosphor material, as an emission wavelength range becomes longer, thermal reliability and chemical reliability are high.

Therefore, a service life of an organic light emitting device can extend by applying a dopant, which emits light of a long wavelength, instead of a dopant which emits light of a short wavelength. However, when an organic light emitting device using a dopant which emits light of a long wavelength is applied to an organic light emitting diode (OLED) panel, the requirement conditions of a sense of color and a viewing angle of the OLED panel are not satisfied. Therefore, a long service life of a device is secured, but the organic light emitting device cannot be applied to the OLED panel.

In the organic light emitting device according to an embodiment of the present invention, emission dopants of different wavelength ranges are respectively applied to the first EML (EML1) and the second EML (EML2), and thus, when the organic light emitting device is applied to the OLED panel, a sense of color is satisfied, and a service life characteristic and an optical reliability of a device can be enhanced.

An optical characteristic experiment has been performed for verifying the above-described effects of the organic light emitting device according to an embodiment of the present invention, and the following experiment result is obtained.

Optical Characteristic Evaluation Result of Embodiment of the Present Invention

Figure 5:
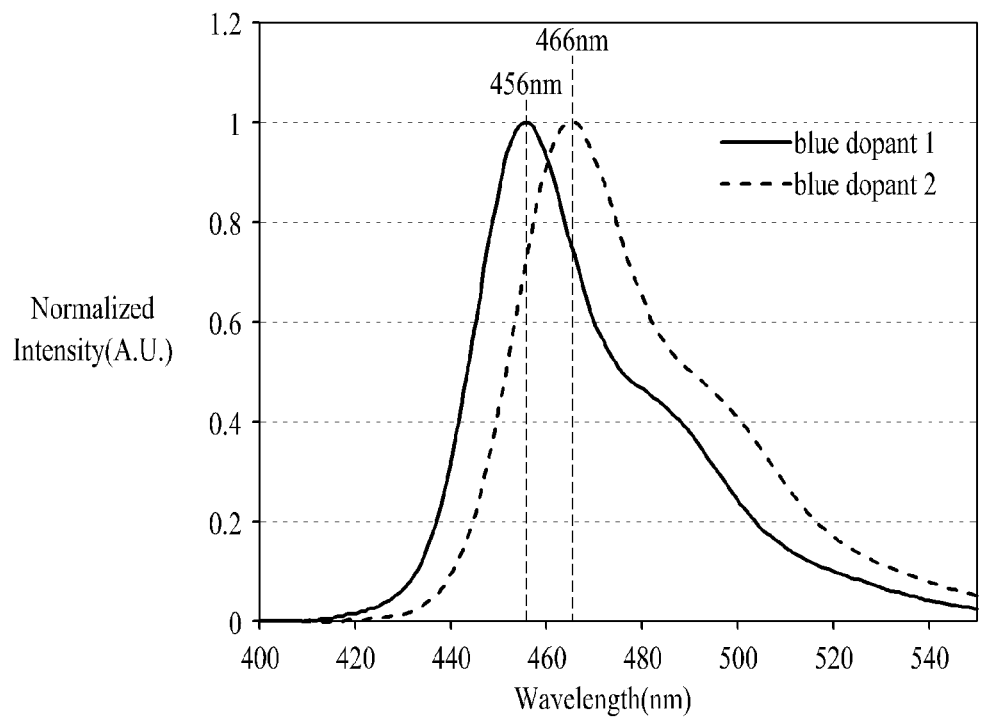
FIG. 5 is a diagram showing emission wavelengths of first and second blue dopants according to an embodiment of the present invention.
Figure 6:
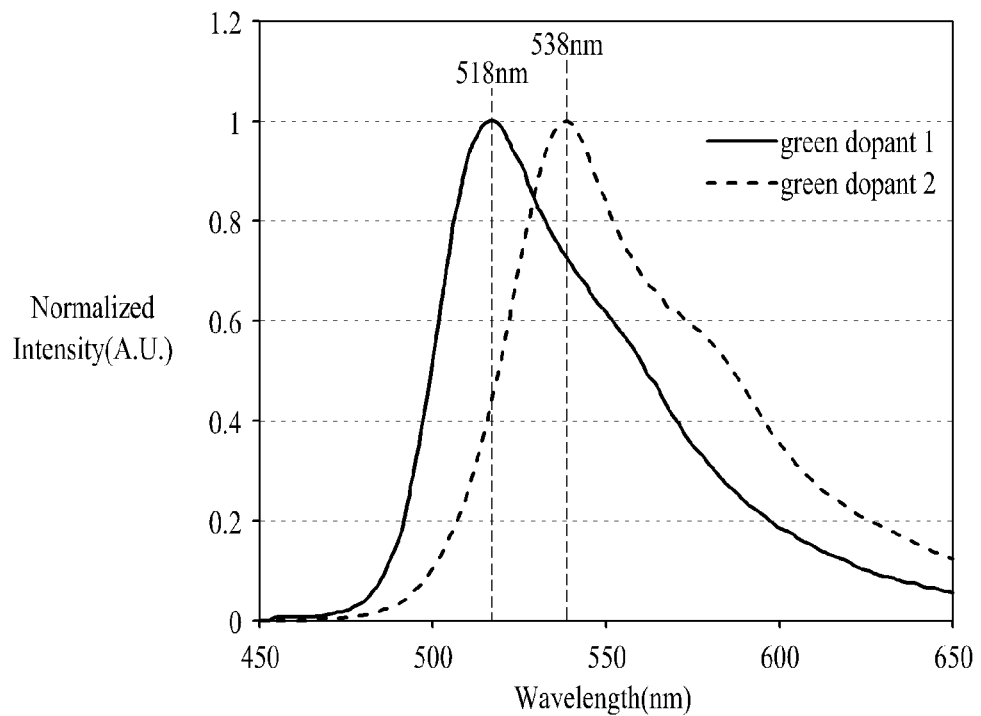
FIG. 6 is a diagram showing emission wavelengths of first and second green dopants according to an embodiment of the present invention.
Figures 7, 8:
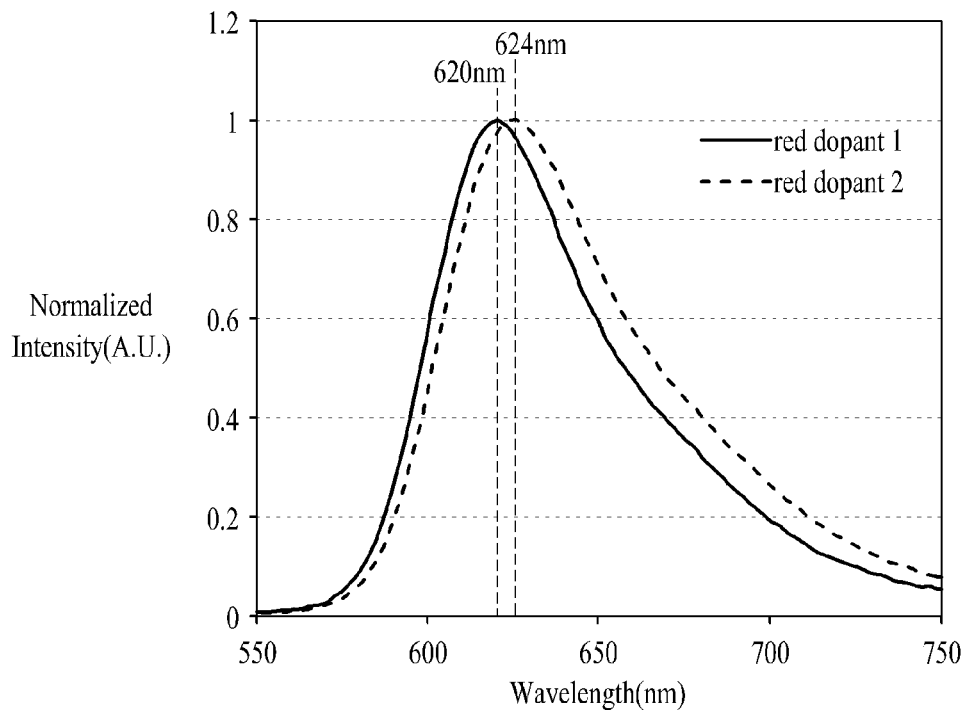
FIG. 7 is a diagram showing emission wavelengths of first and second red dopants according to an embodiment of the present invention.
FIG. 8 is a diagram showing a comparison result of a characteristic evaluation of a comparative example and first and second embodiments of the present invention.

FIG. 4 is a diagram showing main peaks of unique emission wavelengths of dopants applied to first and second emission layers according to embodiments of the present invention. FIG. 5 is a diagram showing emission wavelengths of first and second blue dopants according to an embodiment of the present invention. FIG. 6 is a diagram showing emission wavelengths of first and second green dopants according to an embodiment of the present invention. FIG. 7 is a diagram showing emission wavelengths of first and second red dopants according to an embodiment of the present invention.

To provide a description with common reference to FIGS. 3 and 4, an optical characteristic experiment result of the comparative example illustrated in FIG. 1 is compared with an optical characteristic experiment result of an embodiment of the present invention illustrated in FIG. 3.

In an organic light emitting device according to a first embodiment of the present invention, dopants having the same wavelength ranges are applied to a first EML (EML1) and a second EML (EML2).

In the organic light emitting device according to the first embodiment of the present invention, a dopant in which a main peak of a unique emission wavelength is 456 nm is applied to a first blue EML (blue EML1) 136 and a second blue EML (blue EML2) 166.

In the organic light emitting device according to the first embodiment of the present invention, a dopant in which a main peak of a unique emission wavelength is 518 nm is applied to a first green EML (green EML1) 134 and a second green EML (green EML2) 164.

In the organic light emitting device according to the first embodiment of the present invention, a dopant in which a main peak of a unique emission wavelength is 620 nm is applied to a first red EML (red EML1) 132 and a second red EML (red EML2) 162.

In an organic light emitting device according to a second embodiment of the present invention, emission dopants having different wavelength ranges are applied to a first EML (EML1) and a second EML (EML2). Here, a first dopant and a second dopant having different emission wavelength ranges may be applied by applying a chemical structure having a different functional group to the same center material derivatives.

A difference between a main peak of a unique emission wavelength of a first blue dopant and a main peak of a unique emission wavelength of a second blue dopant is within 30 nm. Also, a difference between a main peak of a unique emission wavelength of a first green dopant and a main peak of a unique emission wavelength of a second green dopant is within 30 nm. Also, a difference between a main peak of a unique emission wavelength of a first red dopant and a main peak of a unique emission wavelength of a second red dopant is within 30 nm.

As illustrated in FIG. 5, in the organic light emitting device according to the second embodiment of the present invention, a first blue dopant (blue dopant1) in which a main peak of a unique emission wavelength is 456 nm is applied to a first blue EML (blue EML1) 136 of a first emission unit (unit1). A second blue dopant (blue dopant2) in which a main peak of a unique emission wavelength is 466 nm is applied to a second blue EML (blue EML2) 166 of a second emission unit (unit2).

As illustrated in FIG. 6, in the organic light emitting device according to the second embodiment of the present invention, a first green dopant (green dopant1) in which a main peak of a unique emission wavelength is 518 nm is applied to a first green EML (green EML1) 134 of the first emission unit (unit1). A second green dopant (green dopant2) in which a main peak of a unique emission wavelength is 538 nm is applied to a second green EML (green EML2) 164 of the second emission unit (unit2).

As illustrated in FIG. 7, in the organic light emitting device according to the second embodiment of the present invention, a first red dopant (red dopant1) in which a main peak of a unique emission wavelength is 620 nm is applied to a first red EML (red EML1) 132 of the first emission unit (unit1). A second red dopant (red dopant2) in which a main peak of a unique emission wavelength is 624 nm is applied to a second red EML (red EML2) 164 of the second emission unit (unit2).

FIG. 8 is a diagram showing a comparison result of a characteristic evaluation of a comparative example and first and second embodiments of the present invention.

Referring to FIG. 8, to describe color coordinates of the comparative example of FIG. 1, CIE_x of a blue pixel is 0.143, and CIE_y of the blue pixel is 0.052. Also, CIE_x of a green pixel is 0.215, and CIE_y of the green pixel is 0.732. Also, CIE_x of a red pixel is 0.673, and CIE_y of the red pixel is 0.323.

To describe color coordinates of the first embodiment of the present invention in which dopants having the same wavelength range are applied to the first EML (EML1) and the second EML (EML2), CIE_x of a blue pixel is 0.143, and CIE_y of the blue pixel is 0.050. Also, CIE_x of a green pixel is 0.210, and CIE_y of the green pixel is 0.730. Also, CIE_x of a red pixel is 0.675, and CIE_y of the red pixel is 0.324.

To describe color coordinates of the second embodiment of the present invention in which dopants having different unique emission wavelength ranges are applied to the first EML (EML1) and the second EML (EML2), CIE_x of a blue pixel is 0.142, and CIE_y of the blue pixel is 0.052. Also, CIE_x of a green pixel is 0.247, and CIE_y of the green pixel is 0.712. Also, CIE_x of a red pixel is 0.675, and CIE_y of the red pixel is 0.324.

In a driving voltage of the comparative example of FIG. 1, a driving voltage of a blue pixel is 4.1 V, a driving voltage of a green pixel is 3.9 V, and a driving voltage of a red pixel is 3.9 V.

In a driving voltage of the first embodiment of the present invention in which dopants having the same wavelength range are applied to the first EML (EML1) and the second EML (EML2), a driving voltage of a blue pixel is 7.2 V, a driving voltage of a green pixel is 7.0 V, and a driving voltage of a red pixel is 7.2 V.

In a driving voltage of the second embodiment of the present invention in which dopants having different unique emission wavelength ranges are applied to the first EML (EML1) and the second EML (EML2), a driving voltage of a blue pixel is 7.1 V, a driving voltage of a green pixel is 6.4 V, and a driving voltage of a red pixel is 7.2 V.

In an efficiency of a current of the comparative example of FIG. 1, an efficiency of a current of a blue pixel is 5.3 [cd/A], an efficiency of a current of a green pixel is 114.2 [cd/A], and an efficiency of a current of a red pixel is 48.6 [cd/A].

In an efficiency of a current of the first embodiment of the present invention in which dopants having the same wavelength range are applied to the first EML (EML1) and the second EML (EML2), an efficiency of a current of a blue pixel is 7.8 [cd/A], an efficiency of a current of a green pixel is 160.8 [cd/A], and an efficiency of a current of a red pixel is 70.2 [cd/A].

In an efficiency of a current of the second embodiment of the present invention in which dopants having different unique emission wavelength ranges are applied to the first EML (EML1) and the second EML (EML2), an efficiency of a current of a blue pixel is 8.0 [cd/A], an efficiency of a current of a green pixel is 177.6 [cd/A], and an efficiency of a current of a red pixel is 65.5 [cd/A].

In a power efficiency of the comparative example of FIG. 1, a power efficiency of a blue pixel is 3.8 [lm/W], a power efficiency of a green pixel is 91.8 [lm/W], and a power efficiency of a red pixel is 39 [lm/W].

In a power efficiency of the first embodiment of the present invention in which dopants having the same wavelength range are applied to the first EML (EML1) and the second EML (EML2), a power efficiency of a blue pixel is 3.3 [lm/W], a power efficiency of a green pixel is 78 [lm/W], and a power efficiency of a red pixel is 27 [lm/W].

In a power efficiency of the second embodiment of the present invention in which dopants having different unique emission wavelength ranges are applied to the first EML (EML1) and the second EML (EML2), a power efficiency of a blue pixel is 3.5 [lm/W], a power efficiency of a green pixel is 87.3 [lm/W], and a power efficiency of a red pixel is 26 [lm/W].

As illustrated in FIG. 8, to describe the organic light emitting device according to the first and second embodiments of the present invention in comparison with the comparative example, it can be seen that an efficiency of a current and a power efficiency of the organic light emitting device according to the first and second embodiments of the present invention are better than those of the comparative example.

Figure 9:
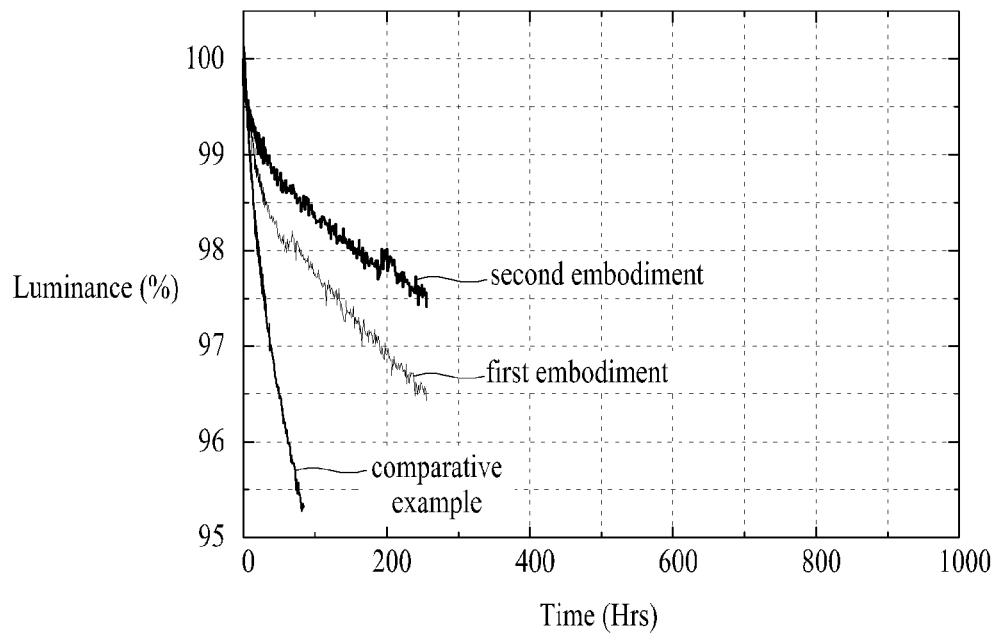
FIG. 9 is a diagram showing a comparison result of a luminance reduction of a blue emission layer caused by the elapse of a driving time in a comparative example and first and second embodiments of the present invention.

FIG. 9 is a diagram showing a comparison result of a luminance reduction of a blue emission layer caused by the elapse of a driving time in a comparative example and first and second embodiments of the present invention.

Referring to FIG. 9, in the comparative example, when a driving time of 100 hours elapses, a luminance of a blue pixel is reduced by 95% of initial luminance. On the other hand, in the organic light emitting device according to the first embodiment of the present invention, when a driving time of 250 hours elapses, a luminance of a blue pixel is reduced by 96.5% of initial luminance. Also, in the organic light emitting device according to the second embodiment of the present invention, when a driving time of 250 hours elapses, a luminance of a blue pixel is reduced by 97.5% of initial luminance.

Therefore to describe a service life of the blue pixel of the organic light emitting device according to the first and second embodiments of the present invention in comparison with a service life of the blue pixel of the comparative example, it can be seen that a service life of the blue pixel of the organic light emitting device according to the first and second embodiments of the present invention is better than that of the blue pixel of the comparative example.

Figure 10:
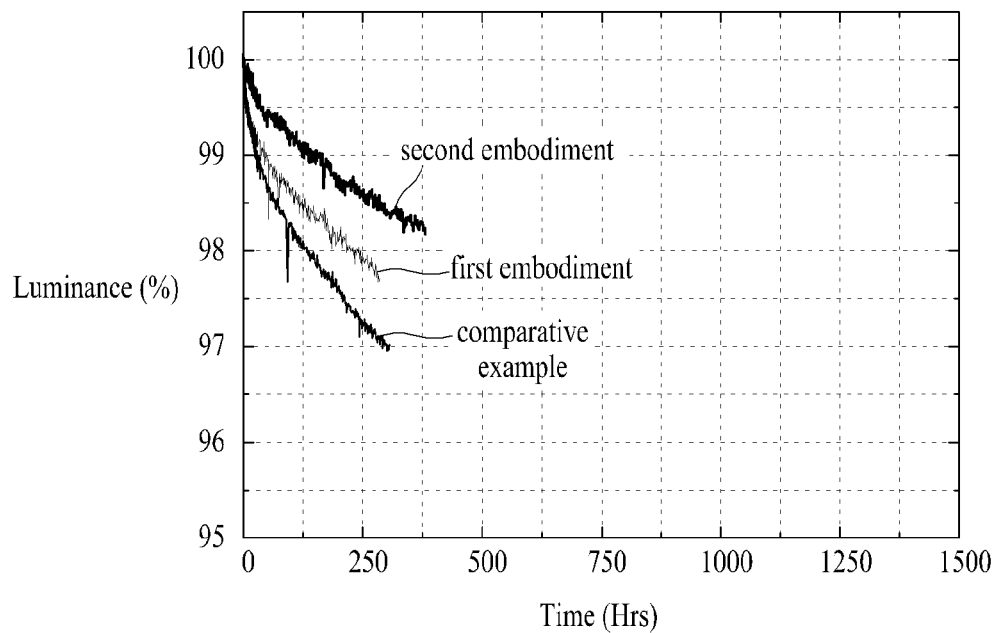
FIG. 10 is a diagram showing a comparison result of a luminance reduction of a green emission layer caused by the elapse of a driving time in a comparative example and first and second embodiments of the present invention.

FIG. 10 is a diagram showing a comparison result of a luminance reduction of a green emission layer caused by the elapse of a driving time in a comparative example and first and second embodiments of the present invention.

Referring to FIG. 10, in the comparative example, when a driving time of 250 hours elapses, a luminance of a green pixel is reduced by 97% of initial luminance. On the other hand, in the organic light emitting device according to the first embodiment of the present invention, when a driving time of 250 hours elapses, a luminance of a green pixel is reduced by 98% of initial luminance. Also, in the organic light emitting device according to the second embodiment of the present invention, when a driving time of 250 hours elapses, a luminance of a green pixel is reduced by 98.5% of initial luminance.

Therefore to describe a service life of the green pixel of the organic light emitting device according to the first and second embodiments of the present invention in comparison with a service life of the green pixel of the comparative example, it can be seen that a service life of the green pixel of the organic light emitting device according to the first and second embodiments of the present invention is better than that of the green pixel of the comparative example.

Figure 11:
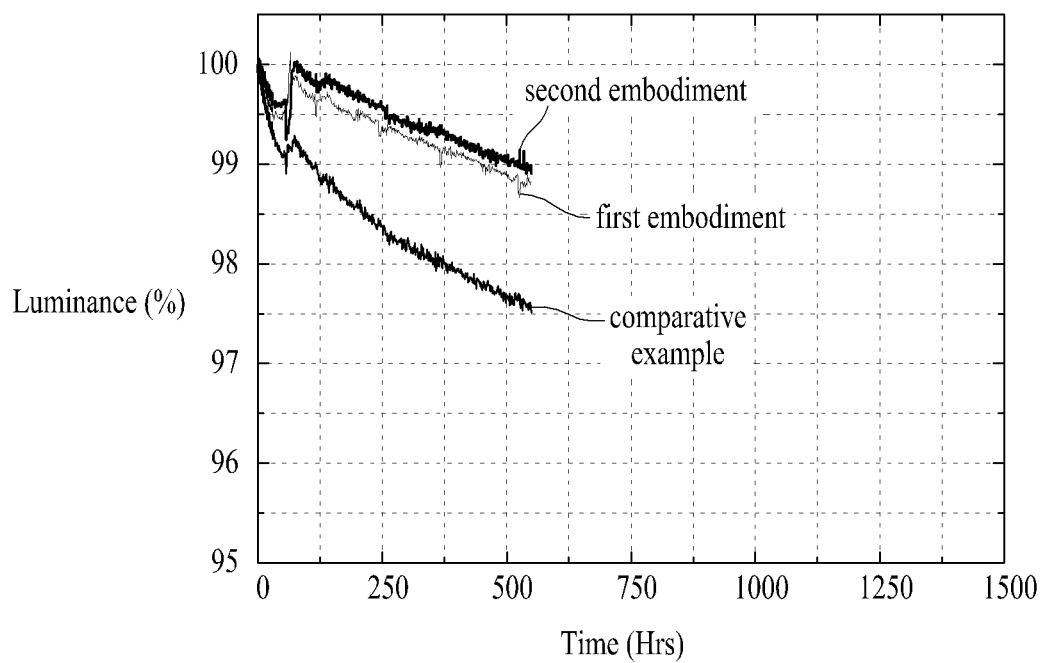
FIG. 11 is a diagram showing a comparison result of a luminance reduction of a red emission layer caused by the elapse of a driving time in a comparative example and first and second embodiments of the present invention.

FIG. 11 is a diagram showing a comparison result of a luminance reduction of a red emission layer caused by the elapse of a driving time in a comparative example and first and second embodiments of the present invention.

Referring to FIG. 11, in the comparative example, when a driving time of 500 hours elapses, a luminance of a red pixel is reduced by 97.5% of initial luminance. On the other hand, in the organic light emitting device according to the first embodiment of the present invention, when a driving time of 500 hours elapses, a luminance of a red pixel is reduced by 99% of initial luminance. Also, in the organic light emitting device according to the second embodiment of the present invention, when a driving time of 500 hours elapses, a luminance of a red pixel is reduced by 99% of initial luminance.

Therefore to describe a service life of the red pixel of the organic light emitting device according to the first and second embodiments of the present invention in comparison with a service life of the red pixel of the comparative example, it can be seen that a service life of the red pixel of the organic light emitting device according to the first and second embodiments of the present invention is better than that of the red pixel of the comparative example.

As described with reference to FIGS. 9 to 11, a service life of each of the red pixel, the green pixel, and the blue pixel of the organic light emitting device according to the first and second embodiments of the present invention is better than the comparative example.

Figure 12:
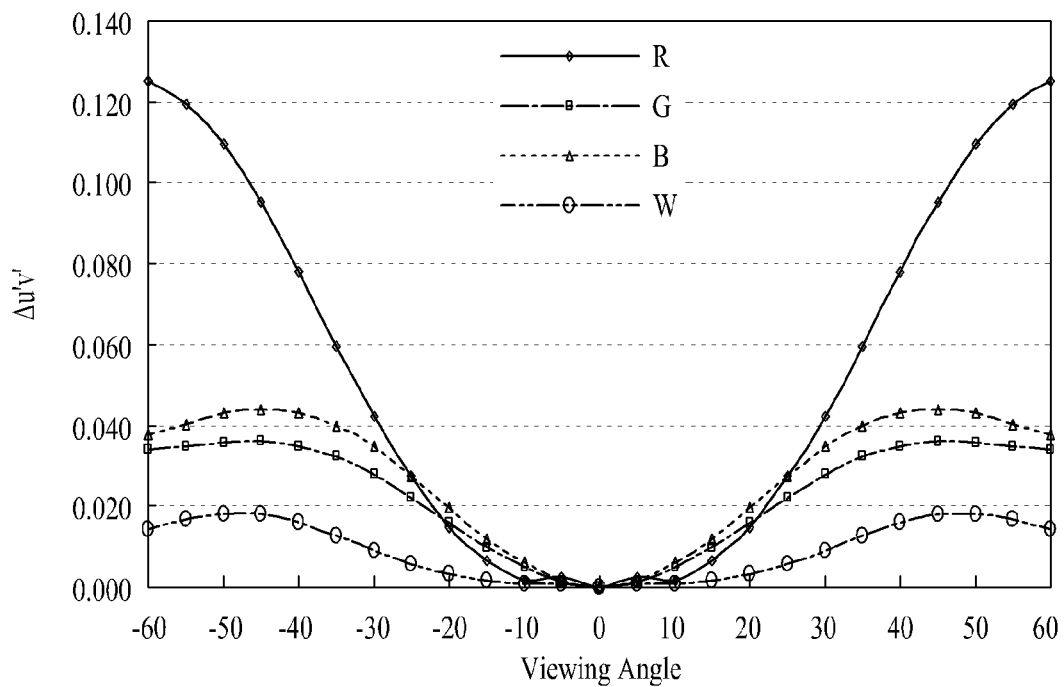
FIG. 12 is a diagram showing a service life and a viewing angle characteristic of an embodiment of the present invention.
Figure 13:
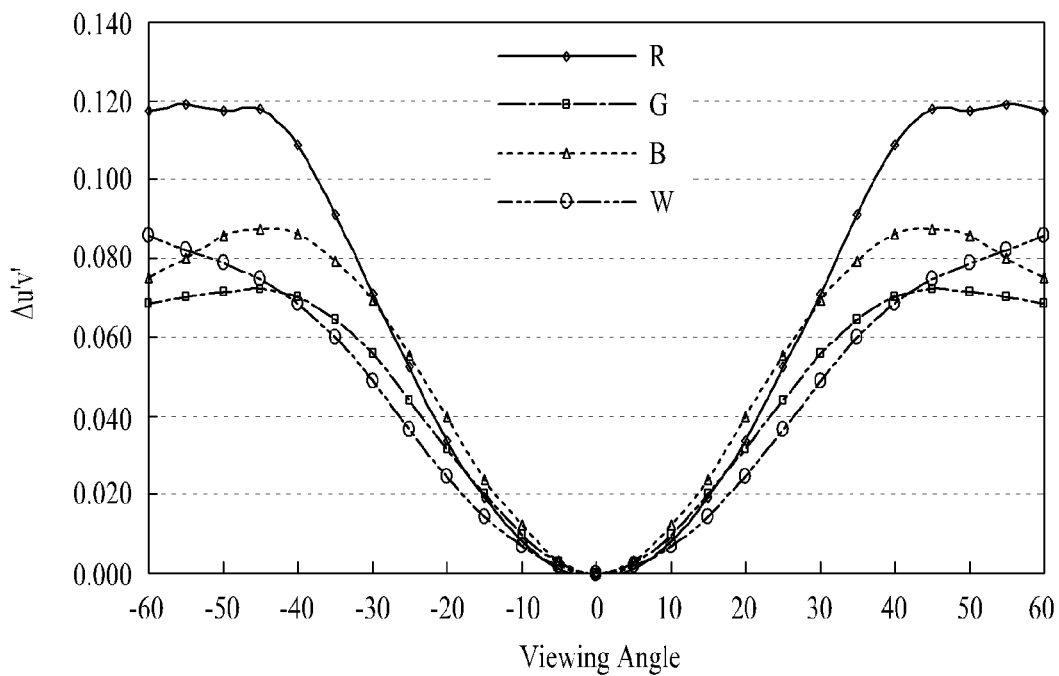
FIG. 13 is a diagram showing a service life and a viewing angle characteristic of a second embodiment of the present invention.

FIG. 12 is a diagram showing a service life and a viewing angle characteristic of an embodiment of the present invention, and FIG. 13 is a diagram showing a service life and a viewing angle characteristic of a second embodiment of the present invention.

Referring to FIGS. 12 and 13, a light efficiency of the first and second embodiments of the present invention is higher than that of the comparative example of FIG. 1.

In a color coordinate margin necessary for applying an organic light emitting device to an OLED panel, as listed in Table 2, CIE_x of a red pixel is 0.670 to 0.678, CIE_x of a green pixel is 0.210 to 0.260, and CIE_y of a blue pixel is 0.045 to 0.060.

To compare and describe the first embodiment of the present invention and the second embodiment of the present invention, a sense of color is more satisfied, and a service life of a light emitting device becomes longer in a case, where dopants having different unique emission wavelength ranges are applied to the first EML (EML1) and the second EML (EML2), than a case where dopants having the same wavelength range are applied to the first EML (EML1) and the second EML (EML2).

Although dopants having different unique emission wavelength ranges are not applied to the first EML (EML1) and second EML (EML2) of all of the red pixel, the green pixel, and the blue pixel, by applying dopants having different unique emission wavelength ranges to the first EML (EML1) and second EML (EML2) of at least one selected from the red pixel, the green pixel, and the blue pixel, a sense of color is satisfied, and a service life of a light emitting device can be enhanced.

Particularly, a service life of the blue pixel can be enhanced by two times in comparison with the comparative example, and a service life of the green pixel can be enhanced by 50% or more in comparison with the comparative example. It can be seen that a viewing angle of the red pixel, which fundamentally has an excellent service life, is broadened. That is, in the organic light emitting device according to the embodiments of the present invention, a viewing angle as well as a service life can be enhanced.

As described above, in the organic light emitting device according to the embodiments of the present invention, the organic emission layer is formed in an emission structure including two emission units (2unit). An emission efficiency of red light, green light, and blue light can be enhanced by applying dopants having different unique emission wavelength ranges to the emission layer of the first emission unit and the emission layer of the second emission unit. Further-more, in addition to a luminance of red light, green light, and blue light, a luminance of white light can increase.

Moreover, a service life of an organic light emitting element and a service life of a display panel including the organic light emitting element are enhanced, and a viewing angle of each of red light, green light, and blue light can be improved.

In the organic light emitting device according to the embodiments of the present invention, an organic emission layer is formed in an emission structure including two emission units, and dopants of different unique emission wavelength ranges are respectively applied to an emission layer of a first emission unit and an emission layer of a second emission unit, thereby enhancing an emission efficiency of red light, green light, and blue light.

In the organic light emitting device according to the embodiments of the present invention, an organic emission layer is formed in an emission structure including two emission units, and dopants of different unique emission wavelength ranges are respectively applied to an emission layer of a first emission unit and an emission layer of a second emission unit, thereby enhancing a service life of an organic light emitting element and a service life of a display panel including the organic light emitting element.

In the organic light emitting device according to the embodiments of the present invention, an organic emission layer is formed in an emission structure including two emission units, and dopants of different unique emission wavelength ranges are respectively applied to an emission layer of a first emission unit and an emission layer of a second emission unit, thereby increasing a luminance of white light as well as a luminance of each of red light, green light, and blue light.

In the organic light emitting device according to the embodiments of the present invention, an organic emission layer is formed in an emission structure including two emission units, and dopants of different unique emission wavelength ranges are respectively applied to an emission layer of a first emission unit and an emission layer of a second emission unit, thereby improving a viewing angle of each of red light, green light, and blue light.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device in which a micro cavity is disposed between a first electrode and a second electrode, the organic light emitting device comprising:
   a first emission unit including a first red emission layer in a red pixel, a first green emission layer in a green pixel, and a first blue emission layer in a blue pixel;
   a second emission unit including a second red emission layer in the red pixel, a second green emission layer in the green pixel, and a second blue emission layer in the blue pixel; and
   a charge generation layer disposed between the first emission unit and the second emission unit, wherein,
   the first electrode is a reflective electrode configured to supply an electric charge having a first polarity to the first emission unit and the second emission unit,
   the second electrode is a semi-transmissive electrode configured to supply an electric charge having a second polarity to the first emission unit and the second emission unit, and
   at least one selected from the first red emission layer, the first green emission layer, and the first blue emission layer is configured to emit light having a wavelength range which differs from wavelength ranges of light that the second red emission layer, the second green emission layer, and the second blue emission layer are respectively configured to emit.

2. The organic light emitting device of claim 1, wherein the first emission unit further includes:
   a hole injection layer disposed on the first electrode;
   a first hole transport layer disposed on the hole injection layer; and
   a first electron transport layer disposed on the first red emission layer, the first green emission layer, and the first blue emission layer.

3. The organic light emitting device of claim 2, wherein,
   blue light is emitted out of the blue pixel through the micro cavity of the blue pixel adjusted using a thickness of the first hole transport layer,
   the hole injection layer has substantially same thickness in the red, green, and blue pixels,
   the first hole transport layer has substantially same thickness in the red, green, and blue pixels, and
   the first electron transport layer has substantially same thickness in the red, green, and blue pixels.

4. The organic light emitting device of claim 3, wherein the second emission unit further includes:
   a second hole transport layer disposed on the charge generation layer; and
   a second electron transport layer disposed on the second red emission layer, the second green emission layer, and the second blue emission layer.

5. The organic light emitting device of claim 4, wherein red light is emitted out of the red pixel through the micro cavity of the red pixel adjusted using a thickness of at least one of the first and second red emission layers.

6. The organic light emitting device of claim 4, wherein green light is emitted out of the green pixel through the micro cavity of the green pixel adjusted using a thickness of at least one of the first and second green emission layers.

7. The organic light emitting device of claim 1, wherein,
   an organic emission layer of the red pixel has a thickness of 250 nm to 310 nm,
   an organic emission layer of the green pixel has a thickness of 200 nm to 270 nm, and
   an organic emission layer of the blue pixel has a thickness of 150 nm to 230 nm.

8. The organic light emitting device of claim 1, wherein,
   the first and second red emission layers have a thickness of 65 nm to 85 nm,
   the first and second green emission layers have a thickness of 35 nm to 50 nm, and
   the first and second blue emission layers have a thickness of 15 nm to 30 nm.

9. The organic light emitting device of claim 1, wherein,
   the first red emission layer comprises a first red dopant, and
   the second red emission layer comprises a second red dopant having a unique emission wavelength range which differs from a unique emission wavelength range of the first red dopant.

10. The organic light emitting device of claim 9, wherein a difference between a main peak of an emission wavelength of the first red dopant and a main peak of an emission wavelength of the second red dopant is within 30 nm.

11. The organic light emitting device of claim 10, wherein,
the first red emission layer and the second red emission layer respectively emit red lights having different wavelength ranges,
a difference between the wavelength ranges of the red lights respectively emitted from the first red emission layer and the second red emission layer is within 30 nm, and
red light having one wavelength range is emitted by the micro cavity.

12. The organic light emitting device of claim 1, wherein,
the first green emission layer comprises a first green dopant, and
the second green emission layer comprises a second green dopant having a unique emission wavelength range which differs from a unique emission wavelength range of the first green dopant.

13. The organic light emitting device of claim 12, wherein a difference between a main peak of an emission wavelength of the first green dopant and a main peak of an emission wavelength of the second green dopant is within 30 nm.

14. The organic light emitting device of claim 13, wherein,
the first green emission layer and the second green emission layer respectively emit green lights having different wavelength ranges,
a difference between the wavelength ranges of the green lights respectively emitted from the first green emission layer and the second green emission layer is within 30 nm, and
green light having one wavelength range is emitted by the micro cavity.

15. The organic light emitting device of claim 1, wherein,
the first blue emission layer comprises a first blue dopant, and
the second blue emission layer comprises a second blue dopant having a unique emission wavelength range which differs from a unique emission wavelength range of the first blue dopant.

16. The organic light emitting device of claim 15, wherein a difference between a main peak of an emission wavelength of the first blue dopant and a main peak of an emission wavelength of the second blue dopant is within 30 nm.

17. The organic light emitting device of claim 16, wherein,
the first blue emission layer and the second blue emission layer respectively emit blue lights having different wavelength ranges,
a difference between the wavelength ranges of the blue lights respectively emitted from the first blue emission layer and the second blue emission layer is within 30 nm, and
blue light having one wavelength range is emitted by the micro cavity.

18. The organic light emitting device of claim 1, wherein a wavelength range of light the first red emission layer is configured to emit differs from a wavelength range of light the second red emission layer is configured to emit.

19. The organic light emitting device of claim 1, wherein a wavelength range of light the first green emission layer is configured to emit differs from a wavelength range of light the second green emission layer is configured to emit.

20. The organic light emitting device of claim 1, wherein a wavelength range of light the first blue emission layer is configured to emit differs from a wavelength range of light the second blue emission layer is configured to emit.

* * * * *